US009106053B2

(12) United States Patent
Wunderer

(10) Patent No.: US 9,106,053 B2
(45) Date of Patent: Aug. 11, 2015

(54) DISTRIBUTED FEEDBACK SURFACE EMITTING LASER

(71) Applicant: Palo Alto Research Center Incorporated, Palo Alto, CA (US)

(72) Inventor: Thomas Wunderer, Palo Alto, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 144 days.

(21) Appl. No.: 13/652,136

(22) Filed: Oct. 15, 2012

(65) Prior Publication Data

US 2014/0133506 A1    May 15, 2014

(51) Int. Cl.
*H01S 5/00* (2006.01)
*H01S 5/12* (2006.01)
*H01S 5/183* (2006.01)
*H01S 5/04* (2006.01)
*H01S 5/343* (2006.01)
*B82Y 20/00* (2011.01)

(52) U.S. Cl.
CPC .............. *H01S 5/1228* (2013.01); *B82Y 20/00* (2013.01); *H01S 5/041* (2013.01); *H01S 5/18361* (2013.01); *H01S 5/18383* (2013.01); *H01S 5/34333* (2013.01); *H01S 5/18358* (2013.01)

(58) Field of Classification Search
CPC ......... H01S 3/10; H01S 3/1055; H01S 3/131; H01S 5/00; H01S 5/04; H01S 5/06; H01S 5/12; H01S 5/18; H01S 5/183; H01S 5/18308
USPC ........ 372/45.01, 38.06, 39, 43.01, 45.012, 96
See application file for complete search history.

(56) References Cited

U.S. PATENT DOCUMENTS

| | | | |
|---|---|---|---|
| 5,796,771 A * | 8/1998 | DenBaars et al. | 372/75 |
| 6,014,250 A * | 1/2000 | Granestrand | 359/344 |
| 6,717,964 B2 | 4/2004 | Jiang et al. | |
| 7,356,062 B2 * | 4/2008 | Brick | 372/49.01 |
| 7,539,227 B2 * | 5/2009 | Kim | 372/45.01 |
| 7,684,454 B2 * | 3/2010 | Kim | 372/45.011 |
| 2003/0235229 A1 * | 12/2003 | Deng et al. | 372/96 |
| 2006/0023757 A1 * | 2/2006 | Mooradian et al. | 372/18 |
| 2009/0238227 A1 * | 9/2009 | Kubota et al. | 372/45.011 |
| 2011/0243173 A1 * | 10/2011 | Bhat et al. | 372/45.012 |

* cited by examiner

*Primary Examiner* — Xinning Niu
*Assistant Examiner* — Vu A Vu
(74) *Attorney, Agent, or Firm* — Hollingsworth Davis, LLC

(57) ABSTRACT

A semiconductor surface emitting laser (SEL) includes an active zone comprising quantum well structures separated by spacer layers. The quantum well structures are configured to provide optical gain for the SEL at a lasing wavelength, $\lambda_{lase}$. Each quantum well structure and an adjacent spacer layer are configured to form an optical pair of a distributed Bragg reflector (DBR). The active zone including a plurality of the DBR optical pairs is configured to provide optical feedback for the SEL at $\lambda_{lase}$.

20 Claims, 24 Drawing Sheets

DESIGN WAVELENGTH: 266nm

| | | MATERIAL | n@266nm | d (Å) | d (λ) |
|---|---|---|---|---|---|
| SUBSTRATE | | AlN | 2.319 | 10000 | 8.718 |
| BARRIER | 16x | AlGaN60 | 2.583 | 51.49 | 0.05 |
| QW | 16x | AlGaN50 | 2.813 | 47.28 | 0.05 |
| BARRIER | 16x | AlGaN60 | 2.583 | 51.49 | 0.05 |
| QW | 16x | AlGaN50 | 2.813 | 47.28 | 0.05 |
| BARRIER | 16x | AlGaN60 | 2.583 | 51.49 | 0.05 |
| SPACER | 16x | AlN | 2.319 | 286.8 | 0.25 |
| LAST BARRIER | 1x | AlGaN60 | 2.583 | 386.2 | 0.375 |
| | | AIR | 1 | 0 | 0 |

(last four rows braced as 0.5 λ; top six rows braced as 16x)

FIG. 3

DESIGN WAVELENGTH: 266nm

| | | MATERIAL | n@266nm | d (Å) | d (λ) |
|---|---|---|---|---|---|
| SUBSTRATE | | AlN | 2.319 | 10000 | 8.718 |
| BARRIER | 30x | AlGaN60 | 2.583 | 360.4 | 0.35 |
| QW | 30x | AlGaN50 | 2.813 | 47.28 | 0.05 |
| BARRIER | 30x | AlGaN60 | 2.583 | 360.4 | 0.35 |
| SPACER | 30x | AlN | 2.319 | 286.8 | 0.25 |
| 1x | | AlGaN60 | 2.583 | 386.2 | 0.375 |
| | | AIR | 1 | 0 | 0 |

{30x on BARRIER/QW/BARRIER/SPACER}
{1.0 λ on last four d(λ) rows}

FIG. 7

DESIGN WAVELENGTH: 266nm

|  |  | MATERIAL | n@266nm | d (Å) | d (λ) |
|---|---|---|---|---|---|
| SUBSTRATE |  | AlN | 2.319 | 10000 | 8.718 |
| BARRIER 1 | 20x | AlGaN60 | 2.583 | 502.1 | 0.4875 |
| QW | 20x | AlGaN50 | 2.813 | 47.28 | 0.05 |
| BARRIER 2 | 20x | AlGaN60 | 2.583 | 51.49 | 0.05 |
| QW | 20x | AlGaN50 | 2.813 | 47.28 | 0.05 |
| BARRIER | 20x | AlGaN60 | 2.583 | 502 | 0.4875 |
| SPACER | 20x | AlN | 2.319 | 430.1 | 0.375 |
| LAST BARRIER | 1x | AlGaN60 | 2.583 | 579.3 | 0.5625 |
|  |  | AIR | 1 | 0 | 0 |

FIG. 11

| MATERIAL | n N@266nm | d (Å) | d (λ) |
|---|---|---|---|
| AlN | 2.319 | 10000 | 8.718 |
| 9 AlGaN60 | 2.583 | 51.49 | 0.05 |
| 9 AlGaN50 | 2.813 | 47.28 | 0.05 |
| 9 AlGaN60 | 2.583 | 51.49 | 0.05 |
| 9 AlGaN60 | 2.583 | 51.49 | 0.05 |
| 9 AlGaN60 | 2.583 | 51.49 | 0.05 |
| 9 AlN | 2.319 | 286.8 | 0.25 |
| AlGaN60 | 2.583 | 51.49 | 0.05 |
| AlGaN50 | 2.813 | 47.28 | 0.05 |
| AlGaN60 | 2.583 | 51.49 | 0.05 |
| AlGaN60 | 2.583 | 51.49 | 0.05 |
| AlGaN60 | 2.583 | 51.49 | 0.05 |
| AlN | 2.319 | 143.4 | 0.125 ← 0.125 λ PHASE SHIFT |
| 9 AlGaN60 | 2.583 | 51.49 | 0.05 |
| 9 AlGaN50 | 2.813 | 47.28 | 0.05 |
| 9 AlGaN60 | 2.583 | 51.49 | 0.05 |
| 9 AlGaN50 | 2.813 | 47.28 | 0.05 |
| 9 AlGaN60 | 2.583 | 51.49 | 0.05 |
| 9 AlN | 2.319 | 286.8 | 0.25 |

9x SQW (rows 2–7), 9x DQW (rows 14–19)

FIG. 17A

| | Material | | | |
|---|---|---|---|---|
| | AlGaN60 | | 2.583 | 51.49 | 0.05 |
| | AlGaN50 | | 2.813 | 47.28 | 0.05 |
| | AlGaN60 | | 2.583 | 51.49 | 0.05 |
| | AlGaN50 | | 2.813 | 47.28 | 0.05 |
| | AlGaN60 | | 2.583 | 51.49 | 0.05 |
| | AlN | | 2.319 | 143.4 | 0.125 ← 0.125 λ PHASE SHIFT |
| 9 | AlGaN60 | | 2.583 | 51.49 | 0.05 |
| 9 | AlGaN60 | | 2.583 | 51.49 | 0.05 |
| 9 | AlGaN60 | | 2.583 | 51.49 | 0.05 |
| 9 | AlGaN50 | | 2.813 | 47.28 | 0.05 |
| 9 | AlGaN60 | | 2.583 | 51.49 | 0.05 |
| 9 | AlN | | 2.319 | 286.8 | 0.25 |
| | AlGaN60 | | 2.583 | 51.49 | 0.05 |
| | AlGaN60 | | 2.583 | 51.49 | 0.05 |
| | AlGaN60 | | 2.583 | 51.49 | 0.05 |
| | AlGaN50 | | 2.813 | 47.28 | 0.05 |
| | AlGaN60 | | 2.583 | 51.49 | 0.05 |
| OUT | AIR | | 1 | 0 | 0 |

9x SQW (rows marked with 9)

FIG. 17B

DESIGN WAVELENGTH: 266nm

|  | | MATERIAL | | N@266nm | d (A) | d (λ) |
|---|---|---|---|---|---|---|
|  | | AlN | | 2.319 | 10000 | 8.784 |
| 15x DQW | 15 | AlGaN60 | | 2.583 | 434.4 | 0.425 |
|  | 15 | AlGaN50 | | 2.813 | 46.92 | 0.05 |
|  | 15 | AlGaN60 | | 2.583 | 51.1 | 0.05 |
|  | 15 | AlGaN50 | | 2.813 | 46.92 | 0.05 |
|  | 15 | AlGaN60 | | 2.583 | 178.9 | 0.175 |
|  | 15 | AlN | | 2.319 | 284.6 | 0.25 |
|  | | AlGaN60 | | 2.583 | 434.4 | 0.425 |
|  | | AlGaN50 | | 2.813 | 46.92 | 0.05 |
|  | | AlGaN60 | | 2.583 | 51.1 | 0.05 |
|  | | AlGaN50 | | 2.813 | 46.92 | 0.05 |
|  | | AlGaN60 | | 2.583 | 178.9 | 0.175 |
| 15x DQW | 15 | AlGaN60 | | 2.583 | 178.9 | 0.175 |
|  | 15 | AlGaN50 | | 2.813 | 46.92 | 0.05 |
|  | 15 | AlGaN60 | | 2.583 | 51.1 | 0.05 |
|  | 15 | AlGaN50 | | 2.813 | 46.92 | 0.05 |
|  | 15 | AlGaN60 | | 2.583 | 434.4 | 0.425 |
|  | 15 | AlN | | 2.319 | 284.6 | 0.25 |
|  | | AlGaN60 | | 2.583 | 178.9 | 0.175 |
|  | | AlGaN50 | | 2.813 | 46.92 | 0.05 |
|  | | AlGaN60 | | 2.583 | 51.1 | 0.05 |
|  | | AlGaN50 | | 2.813 | 46.92 | 0.05 |
|  | | AlGaN60 | | 2.583 | 434.4 | 0.425 |
| OUT | | AIR | | 1 | 0 | 0 |

FIG. 21

DISTRIBUTED FEEDBACK SURFACE EMITTING LASER

STATEMENT REGARDING FEDERALLY SPONSORED RESEARCH AND DEVELOPMENT

This invention was made with Government support under U.S. Army Cooperative Agreement No. W911NF-10-02-0008 awarded by the U.S. Defense Threat Reduction Agency (DTRA). The Government has certain rights in this invention.

BACKGROUND

Semiconductor lasers require optical gain, optical feedback, and a source of energy to initiate and sustain lasing. Surface emitting lasers (SELs) have recently been used as compact semiconductor lasers. Typically, in this type of laser, the laser light resonates between two reflective surfaces perpendicularly through the gain medium and the laser light is emitted perpendicularly to the laser surface. The two reflective surfaces of the laser, e.g. top and bottom distributed Bragg reflectors (DBRs), form the laser cavity and are separated by a thickness which is a multiple of half a wavelength of the laser light. The gain medium, which may comprise one or more quantum wells, for example, is arranged within the laser cavity. Energy is supplied to the gain medium by optical pumping or e-beam excitation, for example, creating holes and electrons that recombine within the gain medium to generate photons.

SUMMARY

Some embodiments involve a semiconductor surface emitting laser (SEL) that includes an active zone including quantum well structures separated by spacer layers. The quantum well structures are configured to provide optical gain for the SEL at a lasing wavelength, $\lambda_{lase}$. Each quantum well structure and an adjacent spacer layer are configured to form an optical pair of a distributed Bragg reflector (DBR), the active zone including a plurality of the DBR optical pairs and configured to provide optical feedback for the SEL at $\lambda_{lase}$.

According to some aspects, $\lambda_{lase}$ is in a range between about 250 nm and about 550 nm.

According to some aspects, the SEL includes an optical pump source configured to emit pump light at pump wavelength, $\lambda_{pump}$ to optically pump the SEL. In some cases, the pump source may be configured to provide in-well pumping of the SEL In some cases, the pump source may be configured to provide barrier pumping of the SEL.

According to some aspects, the SEL includes electron beam source configured to emit an electron beam as excitation source for the active zone of the SEL.

In some implementations, the active zone comprises one or more mesa structures. optical pump source may be used to optically pump the SEL side walls of the one or more mesa structures.

According to some aspects, one or more additional DBRs are used that do not provide optical gain disposed adjacent to the active zone. For example, the one or more additional DBRs may comprise only one DBR.

According to some aspects, the active zone includes one or more first optical pairs that provide the optical gain and the optical feedback interspersed with one or more second optical pairs that provide the optical gain without providing the optical feedback.

According to some aspects, the active zone includes one or more first optical pairs that provide the optical gain and the optical feedback interspersed with one or more third optical pairs that provide the optical feedback without providing the optical gain.

In some embodiments, the active zone includes at least one phase shift element, the phase shift element configured to shift a phase of an optical mode present within the active zone during operation of the SEL. For example, the phase shift element may comprise an optical gain element.

Some embodiments involve a surface emitting laser (SEL), comprising an active zone including quantum well structures, each quantum well structure including one or more quantum wells comprising $Al_xGa_{1-x}N$. The quantum well structures are separated by spacer layers comprising $Al_yGa_{1-y}N$, where y>x The quantum well structures are configured to provide optical gain for the SEL at a lasing wavelength, $\lambda_{lase}$ Each quantum well structure and an adjacent spacer layer are configured to form an optical pair of a distributed Bragg reflector (DBR. Each quantum well structure provides a high refractive index portion of the optical pair and the spacer layer provides a low refractive index portion of the optical pair. The DBR includes a plurality of the optical pairs and provides optical feedback for the SEL at a lasing wavelength, $\lambda_{lase}$.

According to some aspects, a number of the optical pairs is sufficient to provide a reflectivity of greater than about 98λ at $\lambda_{lase}$.

According to some aspects, the active zone is epitaxially grown on a bulk AlN substrate.

Some embodiments involve a semiconductor surface emitting laser (SEL), comprising an active zone including quantum well structures separated by spacer layers. The quantum well structures are configured to provide optical gain for the SEL at a lasing wavelength, $\lambda_{lase}$. Each quantum well structure and an adjacent spacer layer are configured to form an optical pair of a distributed Bragg reflector (DBR) The active zone includes a plurality of the DBR optical pairs and provides optical feedback for the SEL at $\lambda_{lase}$. At least some of the quantum well structures are asymmetrical, each asymmetrical quantum well structure having one or more quantum wells and one or more barriers and the one or more quantum wells are not centered between spacer layers adjacent to the quantum well structure.

For example, in some implementations substantially all of the quantum well structures are asymmetrical.

Some implementations include one or more additional DBRs that do not provide optical gain and which are disposed adjacent to the active zone. The one or more additional DBRs may comprise only one DBR.

Some embodiments involve a semiconductor surface emitting laser (SEL). The active zone of the SEL means for providing optical gain for the SEL at a lasing wavelength, $\lambda_{lase}$ and means for providing optical feedback for the SEL at $\lambda_{lase}$. The means for providing optical gain and the means for providing optical feedback are distributed throughout the active region.

The above summary is not intended to describe each embodiment or every implementation. A more complete understanding will become apparent and appreciated by referring to the following detailed description and claims in conjunction with the accompanying drawings.

BRIEF DESCRIPTION OF THE DRAWINGS

FIG. 3 illustrates the structure of an exemplary DFB SEL design for a lasing wavelength $\lambda$=266 nm that uses sixteen 0.5$\lambda$ double quantum well structures;

FIG. 7 illustrates the structure of an exemplary DFB SEL design for a lasing wavelength $\lambda$=266 nm that uses thirty 1.0$\lambda$ single quantum well structures;

FIG. 11 illustrates the structure of an exemplary DFB SEL design for a lasing wavelength $\lambda$=266 nm that uses twenty 1.5$\lambda$ double quantum well structures;

FIGS. 17A-17B illustrate the structure of an exemplary DFB SEL design that includes phase shift structures;

FIG. 21 illustrates the structure of an exemplary DFB SEL design that includes a phase shift structure;

Like reference numbers in the various drawings refer to like structures.

DESCRIPTION OF VARIOUS EMBODIMENTS

Embodiments discussed herein involve distributed feedback SELs (DFB SELs) that include a distributed feedback (DFB) active zone that provides both optical gain and optical feedback for the laser. In the embodiments described herein, both the optical gain and optical feedback provided by the DFB SEL active zone are distributed throughout the active zone. In some embodiments, the DFB SELs described herein rely on one DFB active zone comprising a heterostructure including multiple pairs of gain structures alternating with spacer layers. This heterostructure provides both the optical gain and the optical feedback for the laser and no additional reflectors are used to provide optical feedback and/or no additional gain elements to provide optical gain are used. In some embodiments, a DFB active zone that combines the functions of optical gain and optical feedback is used in combination with additional reflectors and/or additional gain elements.

Combining the optical gain and optical feedback functions into one DFB active zone significantly reduces the complexity of the laser heterostructure and can increase the overall performance. In some embodiments, the laser does not need any additional reflector beyond the reflector provided by the DFB active zone itself. The DFB SEL embodiments discussed herein facilitate the realization of single longitudinal mode semiconductor lasers.

Figure 1:
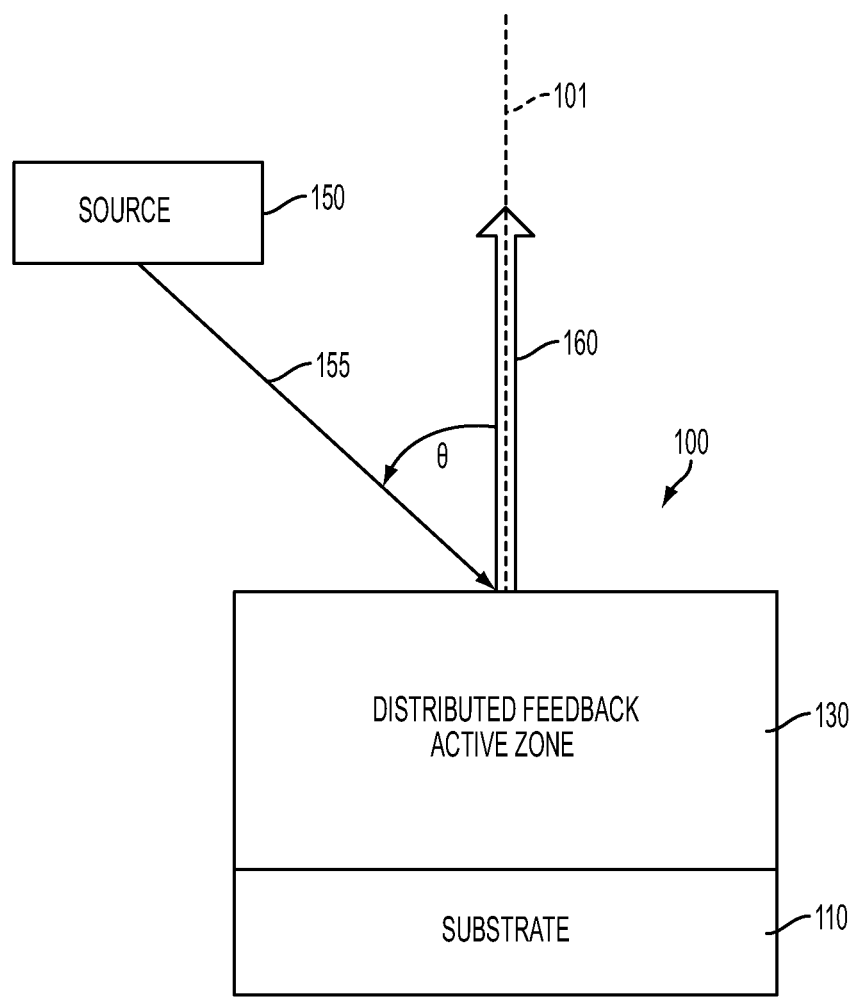
FIG. 1 is a schematic cross sectional diagram of a distributed feedback surface emitting laser (DFB SEL) comprising a distributed feedback (DFB) active zone that provides both optical gain and optical feedback to the laser emission according to various embodiments.

FIG. 1 shows a DFB SEL 100 that includes a DFB active zone 130 that provides both optical gain and optical feedback to the laser 100. The DFB active zone 130 can be epitaxially grown on a compatible substrate 110. An excitation source 150 provides energy to the active zone to facilitate lasing. In some embodiments, the source 150 comprises an optical source that provides pump light 155 to the active zone 130. In general, the pump light 155 is supplied at a shorter wavelength than the emitted laser light 160. In some cases, the pump light 155 may be incident on the laser surface at an angle, $\theta$, with respect to the vector normal 101 to the laser surface. The wavelength and angle of the pump light may be selected to provide in-well or barrier pumping, for example. In some embodiments, the excitation source may comprise an electron beam source configured to direct a beam of electrons towards the laser 100 to excite the DFB active zone.

The DFB active zone 130 provides both optical gain and optical feedback for the laser 100. The DFB active zone includes multiple quantum well structures separated by spacer layers. The quantum well structures include one or more quantum wells that provide optical gain for the laser. Each quantum well structure and an adjacent spacer layer are designed so that they function as an optical pair of a distributed Bragg reflector, wherein the distributed Bragg reflector provides the optical feedback for the laser. Thus, the quantum wells of the quantum well structure of each optical pair provide optical gain for the laser while the combination of the quantum well structure and adjacent spacer layer provide optical feedback.

Although the DFB active zone and other semiconductor portions of the laser 100 may be formed from any suitable semiconductor, in some embodiments, the DFB active zone is based on a III-nitride material system, e.g. AlGaN, AlInN, GaInN, AlGaInN, and/or other such materials. The DFB active zone and/or other semiconductor layers can be epitaxially grown on a bulk aluminum nitride (AlN), a gallium nitride (GaN) substrate, or other suitable substrate. In some cases, the DFB active zone and/or other semiconductor layers can be grown on an AlN, AlGaN, GaInN or GaN template disposed on a substrate of $Al_2O_3$ (sapphire) or other compatible material.

Figure 2:
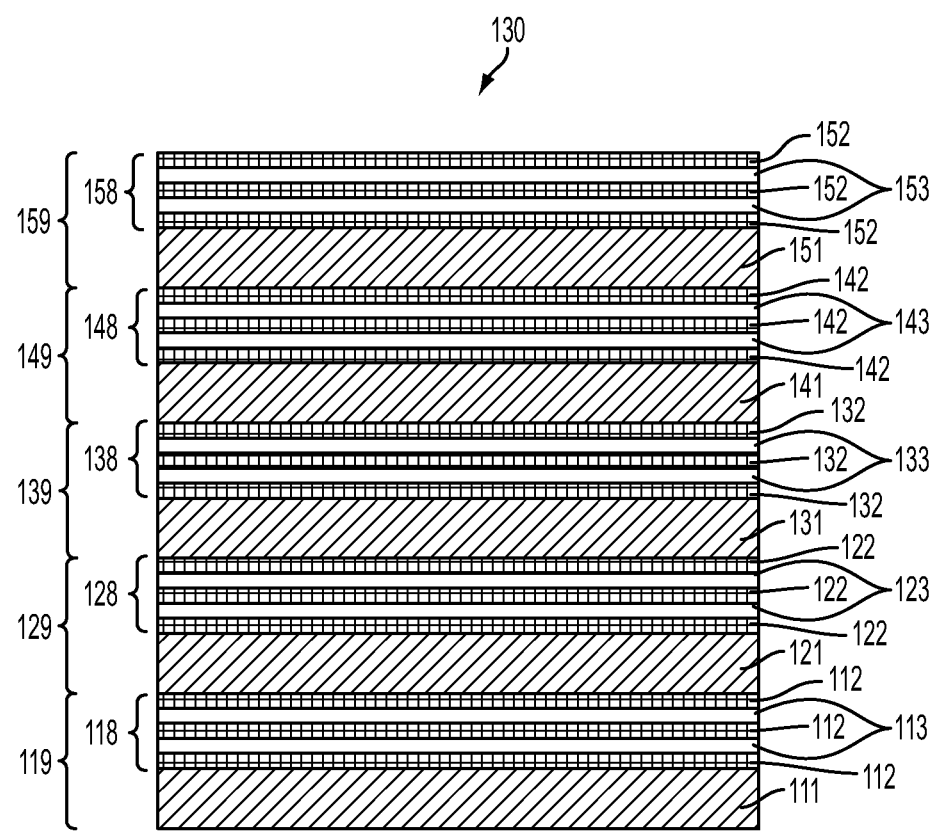
FIG. 2 is a schematic cross sectional view that shows in more detail the DFB active zone of the DFB SEL of FIG. 1.

FIG. 2 is a schematic cross sectional view that shows in more detail the DFB active zone 130 of the laser 100 of FIG. 1. Optical pairs 119, 129, 139, 149, 159 are formed by the quantum well structures 118, 128, 138, 148, 158, and the spacer layers 111, 121, 131, 141, 151. The refractive indices of the quantum well structures 118, 128, 138, 148, 158, and the spacer layers 111, 121, 131, 141, 151 should have sufficient refractive index contrast to provide reflectivity at the laser wavelength without requiring an inordinate number of pairs. In some cases, the quantum well structures 118, 128, 138, 148, 158 and the spacer layers 111, 121, 131, 141, 151 are arranged as repeating optical pairs. The optical thickness of the quantum well structures and of the spacer layers may each equal a multiple of one half the laser wavelength that allows the boundary conditions of the laser cavity to be satisfied such that an optical mode resonates within the laser cavity. The quantum well structures 118, 128, 138, 148, 158 provide the high refractive index layer of each optical pair 119, 129, 139, 149, 159 and the spacer layers 111, 121, 131, 141, 151 provide the low refractive index layer of each optical pair 119, 129, 139, 149, 159.

As illustrated in FIG. 2, the quantum well structures 118, 128, 138, 148, 158 in this example include double quantum wells, wherein each quantum well 113, 123, 133, 143, 153 is separated from an adjacent quantum well and/or from a spacer layer 111, 121, 131, 141, 151 by a barrier 112, 122, 132, 142, 152. It will be understood, that although the quantum well structures 118, 128, 138, 148, 158 shown in FIG. 2 each include two quantum wells 113, 123, 133, 143, 153, in general, the quantum well structures may include only one quantum well, or may include more than two quantum wells. In the example of FIG. 2, the quantum wells 113, 123, 133, 143, 153 are centered within each quantum well structure 118, 128, 138, 148, 158 between the spacer layers 111, 121, 131, 141, 151, a configuration referred to herein as "symmetrical." In the symmetrical configuration of FIG. 2, all of the barriers 112, 122, 132, 142, 152 within the quantum well structures 118, 128, 138, 148, 158 have the same thickness and all of the quantum wells 113, 123, 133, 143, 153 within the quantum well structures 118, 128, 138, 148, 158 have the same thickness.

In some cases, each layer section of the optical pairs, which is the quantum well structure and the spacer layer, has a geometrical thickness of $\lambda_{lase}/4n$, where $\lambda_{lase}$ is the wavelength of the laser light in vacuum and n is the refractive index of the layer. For homogeneous spacer layers (a homogeneous spacer layer is one that has the same material throughout the spacer layer), the geometrical thickness is $\lambda_{lase}/4 n_S$, where $n_S$ is the refractive index of the spacer material. The geometrical thickness of the quantum well structures is $\lambda_{lase}/4n_{eff}$ and can be calculated for a symmetrical quantum well structure as:

$$n_{eff} = ((N_{QW}*d_{QW}*n_{QW}) + (N_{BAR}*d_{BAR}*n_{BAR}))/(N_{QW} + N_{BAR}*d_{BAR}),$$

where $N_{QW}$ is the number of quantum wells, $d_{QW}$ is the thickness of the quantum wells, $n_{QW}$ is the refractive index of the quantum wells, $N_{BAR}$ is the number of barriers, $d_{BAR}$ is the thickness of the barriers, and $n_{BAR}$ is the thickness of the barriers.

For example, consider the active zone of FIG. 2, designed for laser light having a wavelength $\lambda_{lase}=266$ nm, with AlN spacer layers, and symmetrical quantum well structures comprising 4.7 nm $Al_{0.5}Ga_{0.5}N$ quantum wells, and 5.1 nm $Al_{0.6}Ga_{0.4}N$ barriers. The geometrical thickness of the spacer layers is 266 nm/4*2.319=28.7 nm, where 2.319 is the refractive index of AlN at $\lambda=266$ nm. The geometrical thickness of the quantum well structure is 266 nm/$4n_{eff}$. In this example, the refractive index of $Al_{0.5}Ga_{0.5}N$ at 266 nm is 2.813 and the refractive index of $Al_{0.6}Ga_{0.4}N$ at 266 nm is 2.583. Thus, $n_{eff}=((2*4.7$ nm$*2.813)+(3*5.1*2.583))/(2*4.7+3*5.1)=2.670$.

In FIG. 2, the active zone 130 is arranged to provide resonant periodic gain wherein the antinodes of the standing wave electrical field substantially overlap or coincide with the quantum well gain structures. The quantum well structures are spaced at a multiple of one half the laser light wavelength to achieve the resonant periodic gain configuration. The periodicity of the resonant periodic gain configuration, wherein the antinodes of the standing-wave field of the laser light substantially coincide with the quantum well structures, provides a significant increase in the optical gain when compared with similar structures that are non-resonant.

In some optically pumped embodiments, the laser structure is configured such that resonance is achieved at both the laser light and pump light wavelengths to provide both resonant periodic gain by the laser light and resonance enhanced absorption of the pump light. Resonance enhanced absorption occurs when the antinodes of the pump light electromagnetic field substantially coincide with the structures that absorb the pump light. Resonant enhanced absorption can be achieved in two ways. One approach to achieve resonance enhanced absorption involves the use of a laser cavity thickness for which resonances exist at both the pump light wavelength and the laser light wavelength. Another approach to achieve resonance enhanced absorption is to use an off-normal incidence angle for the pump light beam. For example, as shown in FIG. 1, the pump light 155 may be incident on the surface of the laser 100 at an off normal incidence angle of θ. The use of resonance enhanced absorption for laser structures is described in commonly owned U.S. Pat. No. 8,000,371.

The optimal number of optical pairs in the DFB active zone is dependent on the reflectivity of the DFB active zone that in turn is dependent on the refractive index contrast between the layers of the optical pairs. In general, a suitable reflectivity for the DFB active zone is greater than about 98λ. For the example discussed above (28.7 nm AlN spacer layers, 4.7 nm $Al_{0.5}Ga_{0.5}N$ quantum wells, and 5.1 nm $Al_{0.6}Ga_{0.4}N$ barriers), a suitable number of optical pairs to achieve suitable reflectivity, e.g., greater than about 98%, may range between about 15 and about 30 optical pairs.

Three example SEL structures are discussed below and are illustrated in FIGS. 3-14. In examples 1-3, a number of quantum well structures are disposed between a substrate and a final barrier and the lasing wavelength is λ=266 nm. In each example, the quantum well thicknesses are selected to be about 5 nm with 50% Al composition in the quantum wells and with 60% Al composition in the barriers. In each case, a spacer layer is disposed between the quantum well structures. The spacer layers have 100% Al composition. The period thicknesses for the three examples are 0.5λ, 1.0λ, and 1.5λ, respectively, where the refractive index is used to determine the physical thicknesses of the layers. In examples 1 and 2, the last barriers have a thickness of 0.25λ for high reflectivity, although other thicknesses for the last barrier may be used. For example, in example 3, the last barrier has a thickness of 0.375λ. The use of a double quantum well structure requires fewer optical pairs to achieve the same reflectivity, leading to a thinner overall thickness for the SEL which is beneficial to keep growth times relatively short and to not exceed the critical thickness. In examples 1-3, reflectivity greater than 98λ is achieved.

Example 1

Figure 5:
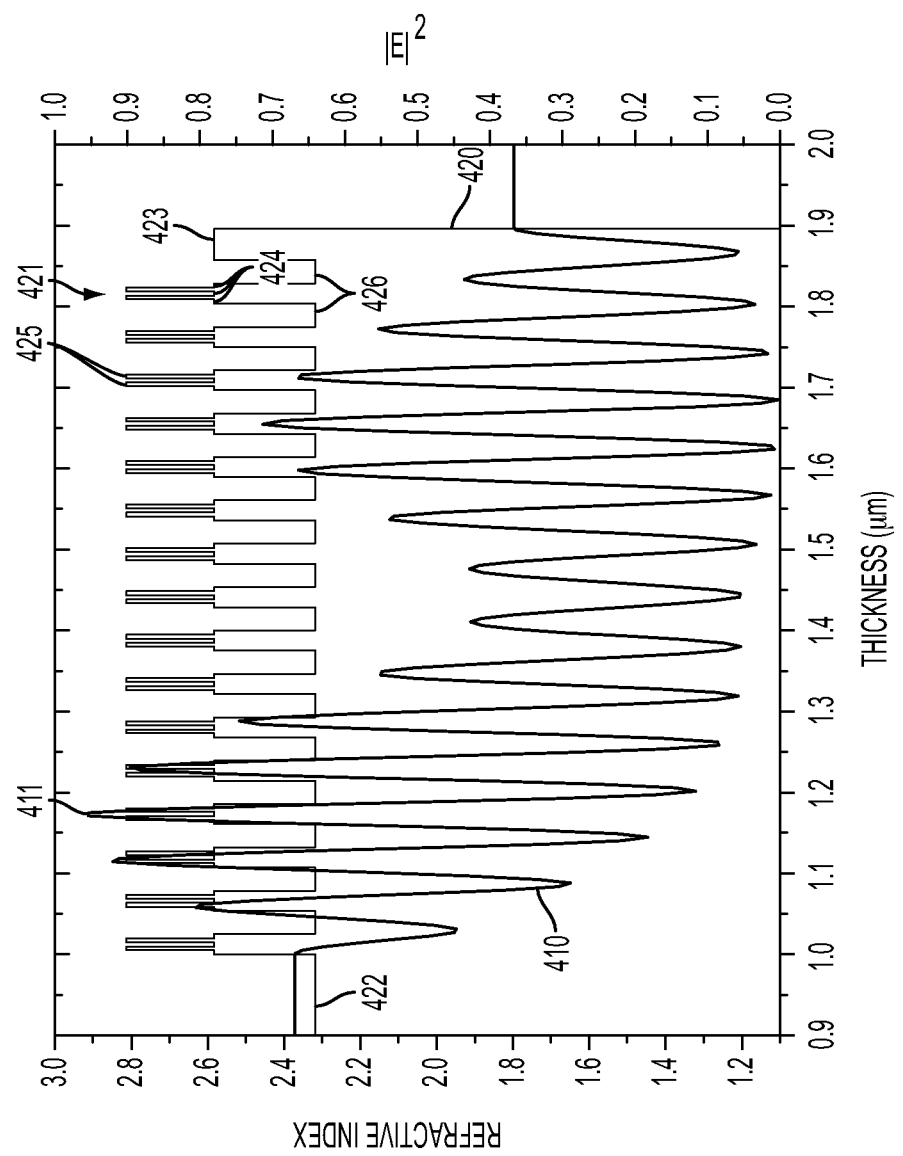

FIG. 3 illustrates the structure of an exemplary DFB SEL design for a lasing wavelength λ=266 nm that uses sixteen 0.5λ double quantum well structures (see, 421, FIG. 5). In the illustrated example, the SEL includes a substrate or template (see, 422, FIG. 5) comprising AlN and having a refractive index of 2.319 at 266 nm. For the simulation a physical thickness of 10000 Å was chosen. The SEL includes a last barrier (423, FIG. 5) comprising $Al_{0.6}Ga_{0.4}N$ having a refractive index of 2.583 at 266 nm, a physical thickness of 386.2 Å, and an optical thickness of 0.375λ. Sixteen repeating double quantum well structures (421, FIG. 5) are disposed between the substrate 422 and the last barrier 423. Each DBR pair has an optical thickness of 0.5× and includes the following layers in order:

1. $Al_{0.6}Ga_{0.4}N$ barrier (424, FIG. 5) having a refractive index of 2.583 at 266 nm, a physical thickness of 51.49 Å, and an optical thickness of 0.05λ;

2. $Al_{0.5}Ga_{0.5}N$ quantum well (425, FIG. 5) having a refractive index of 2.813 at 266 nm, a physical thickness of 47.28 Å, and an optical thickness of 0.05λ;

3. $Al_{0.6}Ga_{0.4}N$ barrier (424, FIG. 5) having a refractive index of 2.583 at 266 nm, a physical thickness of 51.49 Å, and an optical thickness of 0.05λ;

4. $Al_{0.5}Ga_{0.5}N$ quantum well (425, FIG. 5) having a refractive index of 2.813 at 266 nm, a physical thickness of 47.28 Å, and an optical thickness of 0.05λ;

5. $Al_{0.6}Ga_{0.4}N$ barrier (424, FIG. 5) having a refractive index of 2.583 at 266 nm, a physical thickness of 51.49 Å, and an optical thickness of 0.05λ;

6. AlN spacer layer (426, FIG. 5) having a refractive index of 2.319 at 266 nm, a physical thickness of 286.8 Å, and an optical thickness of 0.25λ.

Figure 4:
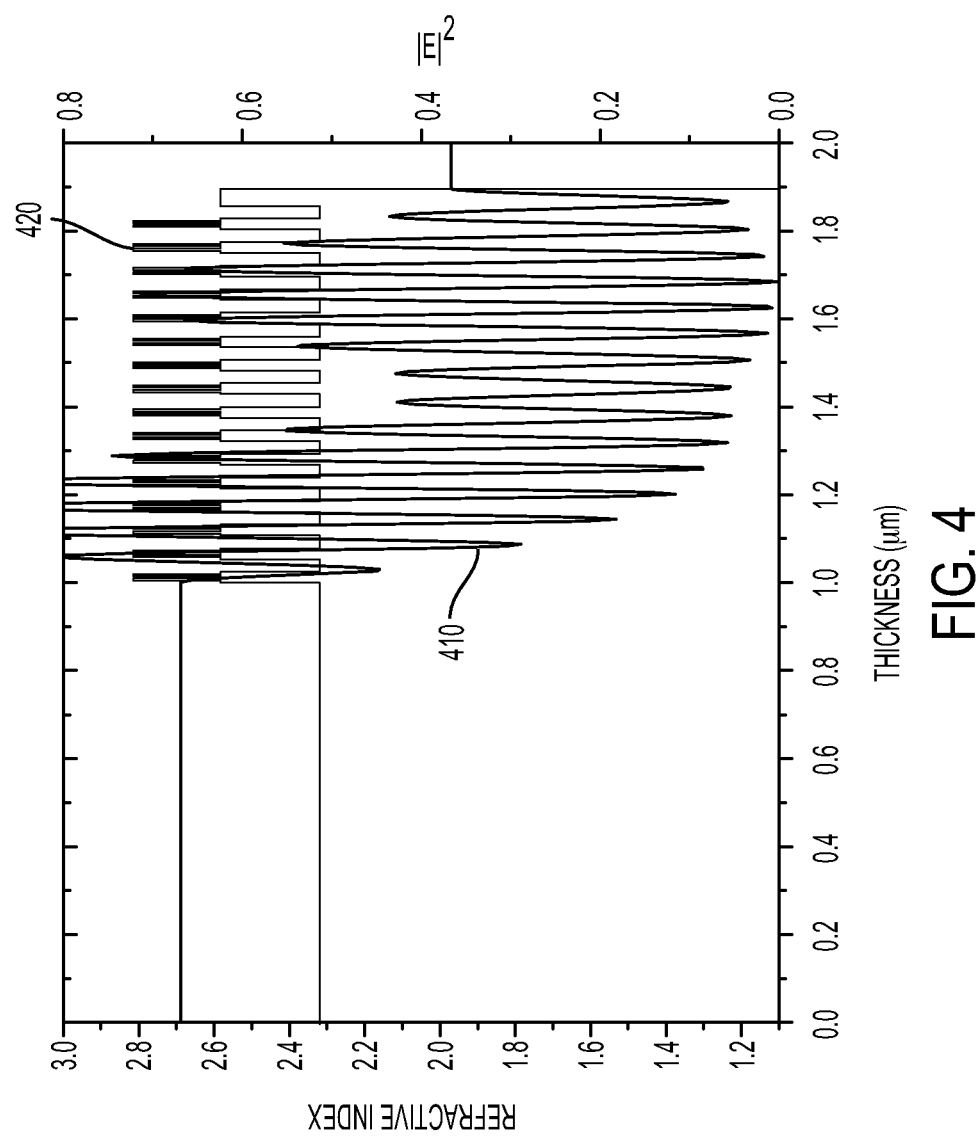
FIGS. 4 and 5 illustrate plots of the $|E|^2$ electrical field and refractive index in the DFB active zone of the SEL structure of FIG. 3.
Figure 6:
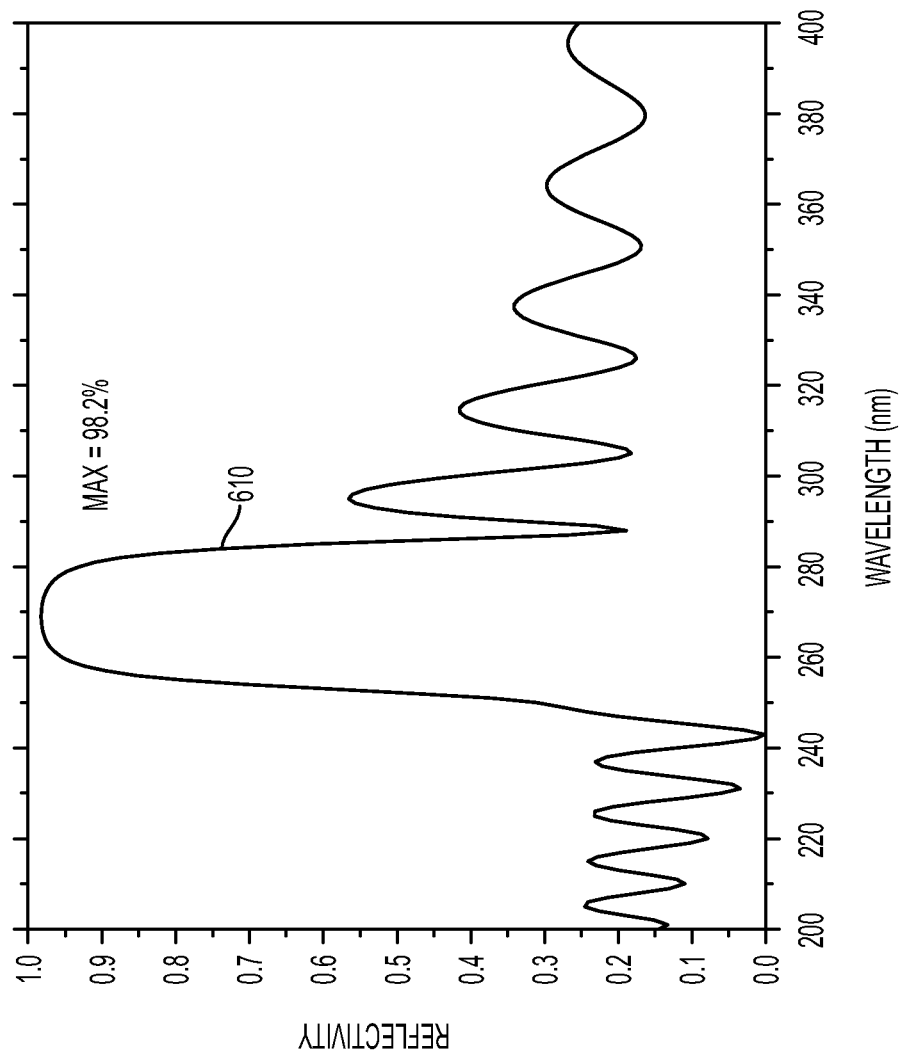
FIG. 6 shows the reflectivity spectra for the DFB SEL of FIG. 3.

FIGS. 4 and 5 illustrate plots of the $|E|^2$ electrical field 410 and refractive index 420 in the DFB active zone of the SEL structure of FIG. 3. FIG. 4 provides plots of the $|E|^2$ electrical field 410 and refractive index 420 within the SEL from 0 to 2 μm (at the last barrier). FIG. 5 provides an expanded view of the same plots 410, 420 within the active region of the SEL. Note that the antinodes 411 of the electric field 410 substantially coincide with the quantum well structures 421 providing resonant periodic gain as previously discussed. FIG. 6 provides a graph 610 of the reflectivity of the structure of FIG. 3 indicating a reflectivity over 98λ at the lasing wavelength λ=266 nm.

Example 2

Figure 8:
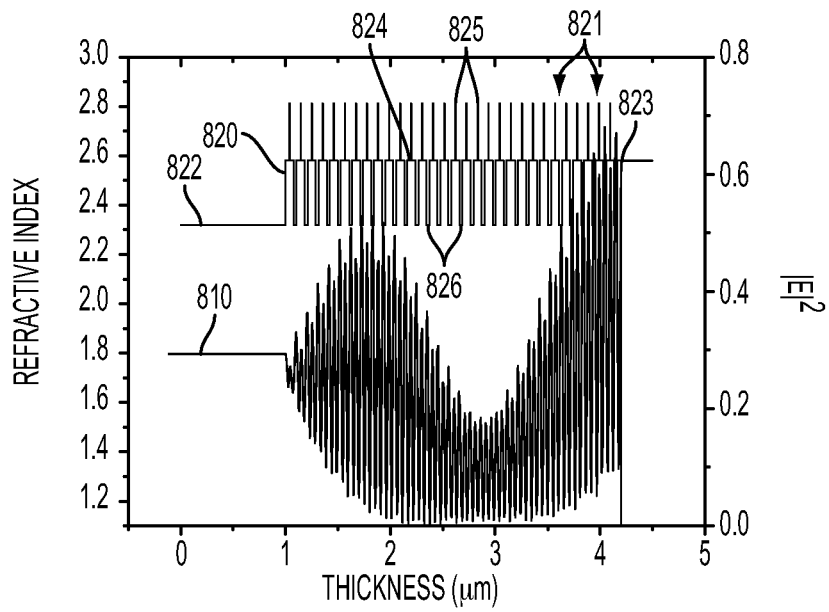
FIGS. 8 and 9 illustrate plots of the $|E|^2$ electrical field and refractive index in the DFB active zone of the SEL structure of FIG. 7.

FIG. 7 illustrates the structure of an exemplary DFB SEL design for a lasing wavelength λ=266 nm that uses thirty 1.0λ single quantum well structures (821, see FIG. 8). In the illustrated example, the SEL includes an AlN substrate or template (822, FIG. 8) that has a refractive index of 2.319 at 266 nm, a physical thickness of 10000 Å, and an optical thickness of 8.718λ. The SEL includes a last barrier (823, FIG. 8) comprising $Al_{0.6}G_{0.4}N$ having a refractive index of 2.583 at 266 nm, a physical thickness of 386.2 Å, and an optical thickness of 0.375λ. Thirty repeating single quantum well structures 821 are disposed between the substrate 822 and the last barrier 823. Each DBR pair has an optical thickness of 0.5λ and includes the following layers in order:

1. $Al_{0.6}Ga_{0.4}N$ barrier (824, FIG. 8) having a refractive index of 2.83 at 266 nm, a physical thickness of 360.4 Å, and an optical thickness of 0.35λ;

2. $Al_{0.5}Ga_{0.5}N$ quantum well (825, FIG. 8) having a refractive index of 2.583 at 266 nm, a physical thickness of 47.28 Å, and an optical thickness of 0.05λ;

3. $Al_{0.6}Ga_{0.4}N$ barrier (824, FIG. 8) having a refractive index of 2.83 at 266 nm, a physical thickness of 360.4 Å, and an optical thickness of 0.35λ;

4. AlN spacer layer (826, FIG. 8) having a refractive index of 2.319 at 266 nm, a physical thickness of 286.8 Å, and an optical thickness of 0.25λ.

Figure 9:
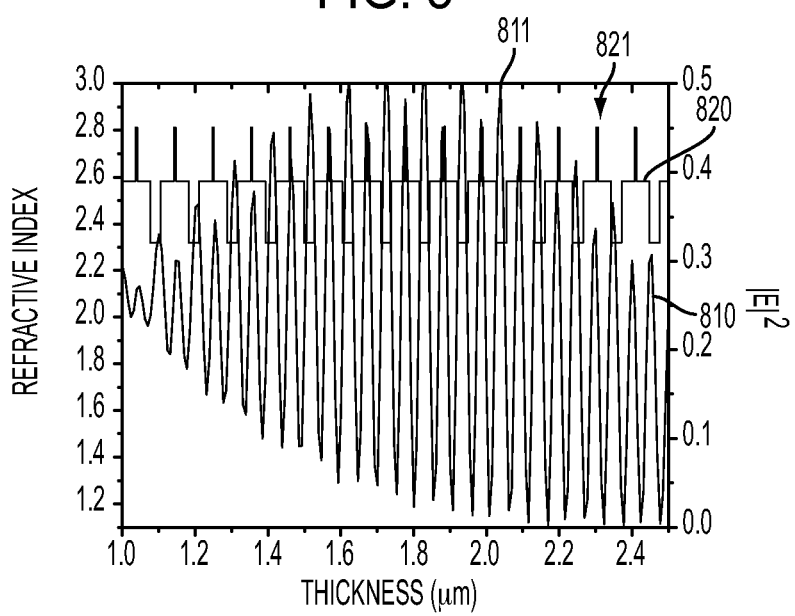
Figure 10:
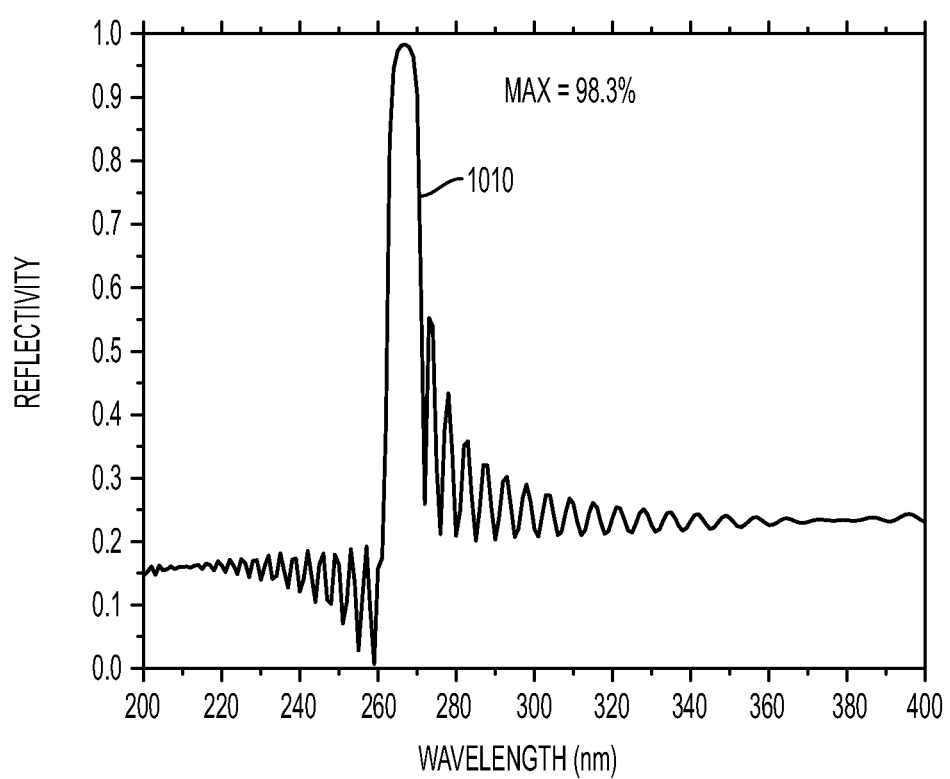
FIG. 10 shows the reflectivity spectra for the DFB SEL of FIG. 7.

FIGS. 8 and 9 illustrate plots of the $|E|^2$ electrical field 810 and refractive index 820 in the DFB active zone of a SEL. FIG. 8 provides plots of the $|E|^2$ electrical field 810 and refractive index 820 within the SEL from 0 to 5 μm. FIG. 9 provides an expanded view of the same plots 810, 820 within the active region of the SEL. Note that the antinodes 811 of the electric field 810 substantially coincide with the quantum well structures 821 providing resonant periodic gain as previously discussed. FIG. 10 provides a graph 1010 of the reflectivity of the structure of FIG. 7 indicating a reflectivity over 98% at the lasing wavelength, λ=266 nm.

Example 3

Figure 12:
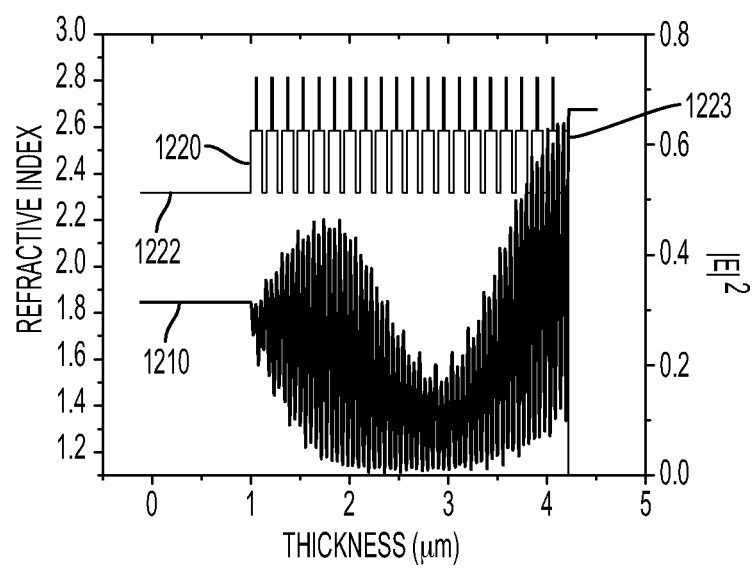
FIGS. 12 and 13 illustrate plots of the $|E|^2$ electrical field and refractive index in the DFB active zone of the SEL structure of FIG. 11.
Figure 13:
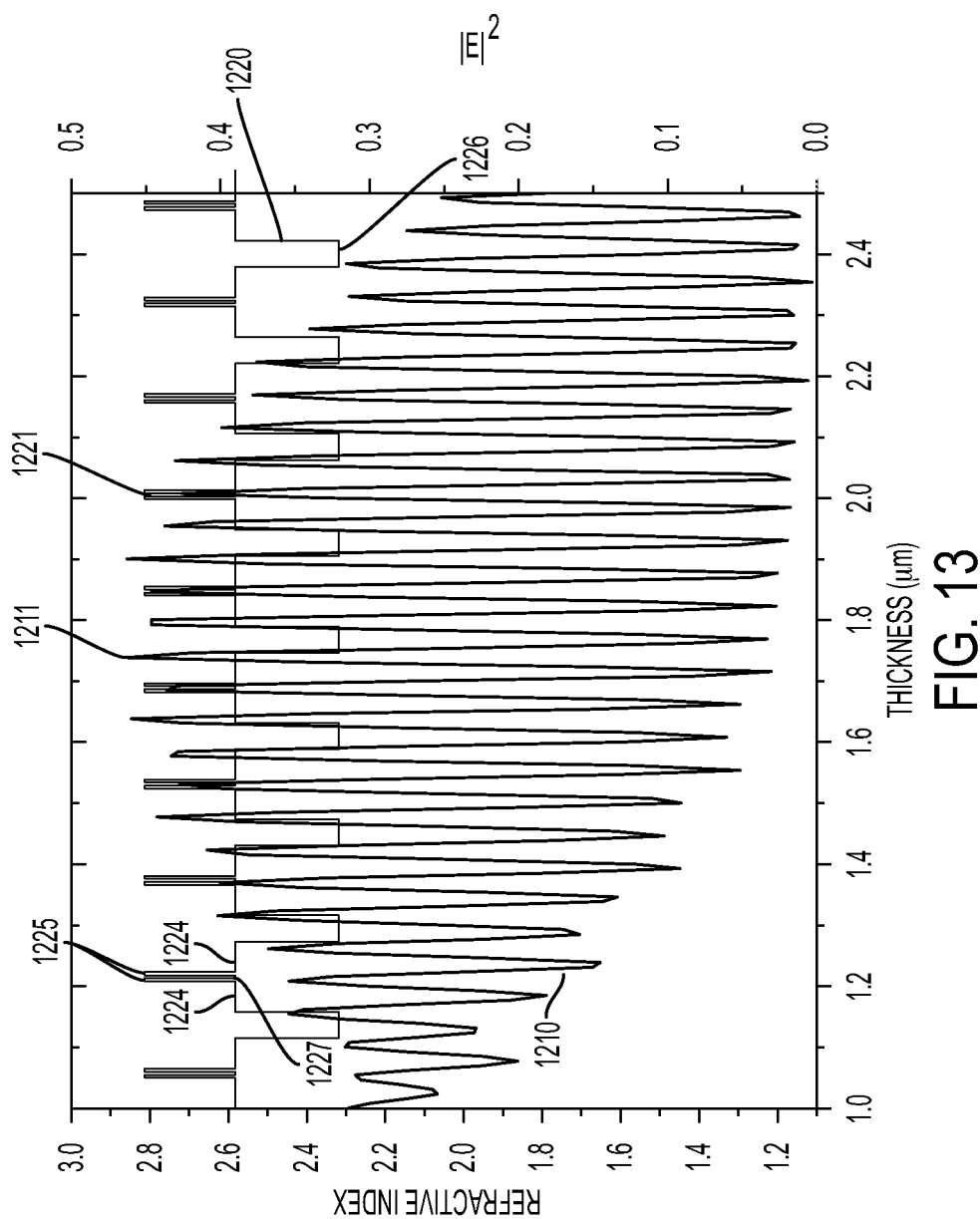
Figure 14:
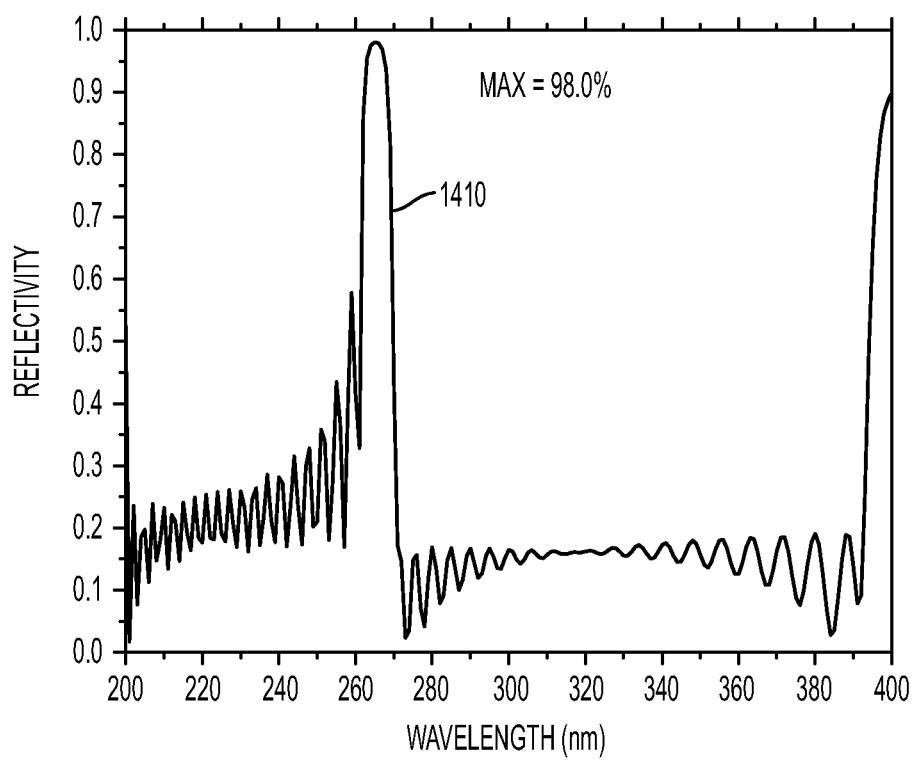
FIG. 14 shows the reflectivity spectra for the DFB SEL of FIG. 11.

FIG. 11 illustrates the structure of an exemplary DFB SEL design for a lasing wavelength λ=266 nm that uses twenty 1.5λ double quantum well structures (1221, FIG. 13). In the illustrated example, two thicker barriers (1224, FIG. 13) are used on either side of the quantum wells (1225, FIG. 13) and one thin barrier (1226, FIG. 13) is used between the quantum wells 1221. The SEL includes a substrate (1222, FIG. 13) comprising AlN and having a refractive index of 2.319 at 266 nm, a physical thickness of 10000 Å, and an optical thickness of 8.718λ. The SEL includes a last barrier (1223, FIG. 12) comprising $Al_{0.6}G_{0.4}N$ having a refractive index of 2.583 at 266 nm, a physical thickness of 579.3 Å, and an optical thickness of 0.5625λ. Twenty repeating double quantum well structures 1221 are disposed between the substrate 1222 and the last barrier 1223. Each DBR pair has an optical thickness of 1.5λ and includes the following layers in order:

1. $Al_{0.6}Ga_{0.4}N$ thick barrier (1224, FIG. 13) having a refractive index of 2.583 at 266 nm, a physical thickness of 502.1 Å, and an optical thickness of 0.4875λ;

2. $Al_{0.5}Ga_{0.5}N$ quantum well (1225, FIG. 13) having a refractive index of 2.813 at 266 nm, a physical thickness of 47.28 Å, and an optical thickness of 0.05λ;

3. $Al_{0.6}Ga_{0.4}N$ thin barrier (1227, FIG. 13) having a refractive index of 2.583 at 266 nm, a physical thickness of 51.49 Å, and an optical thickness of 0.05λ;

4. $Al_{0.5}Ga_{0.5}N$ quantum well (1225, FIG. 13) having a refractive index of 2.813 at 266 nm, a physical thickness of 47.28 Å, and an optical thickness of 0.05λ;

5. $Al_{0.6}Ga_{0.4}N$ thick barrier (1224, FIG. 13) having a refractive index of 2.583 at 266 nm, a physical thickness of 502.1 Å, and an optical thickness of 0.4875λ;

6. AlN spacer layer (1226, FIG. 13) having a refractive index of 2.319 at 266 nm, a physical thickness of 430.1 Å, and an optical thickness of 0.375λ. FIGS. 12 and 13 illustrate plots of the $|E|^2$ electrical field 1210 and refractive index 1220 in the DFB active zone of the SEL of FIG. 11. FIG. 12 provides plots of the $|E|^2$ electrical field 1210 and refractive index 1220 within the SEL from 0 to 5 μm. FIG. 13 provides an expanded view of the same plots 1210, 1220 within the active region of the SEL. Note that the antinodes 1211 of the $|E|^2$ electrical field 1210 substantially coincide with the quantum well structures 1221 providing resonant periodic gain as previously discussed. FIG. 14 provides a graph 1410 of the reflectivity of the structure of FIG. 11 indicating a reflectivity of 98.0λ at the lasing wavelength λ=266 nm.

Referring back to FIG. 2, when the device has a design that satisfies certain boundary conditions, the antinodes of the electric field substantially overlap with the quantum wells, and resonant periodic gain can occur in the gain structure that increases the efficiency of the device. In DBRs formed of alternating layers of low and high refractive index materials that do not include gain structures (e.g., quantum wells) the antinodes of the electric field spontaneously occur at the interfaces between the high and low refractive index layers of the optical pairs. In a DFB active zone, there can be some distance between the antinode position in the quantum well structure that satisfies the condition for resonant periodic gain and the interface between the high and low refractive index layers. It can be useful to design the quantum well structure so that the distance between the antinode position within the quantum well structure that provides the optimal resonant periodic gain and the interface between the high and low refractive index layers is decreased. Decreasing the distance between the optimal antinode position for resonant periodic gain and the interface can be accomplished using asymmetrical quantum well structures as described in more detail below in connection with FIGS. 15 and 16.

Figure 15:
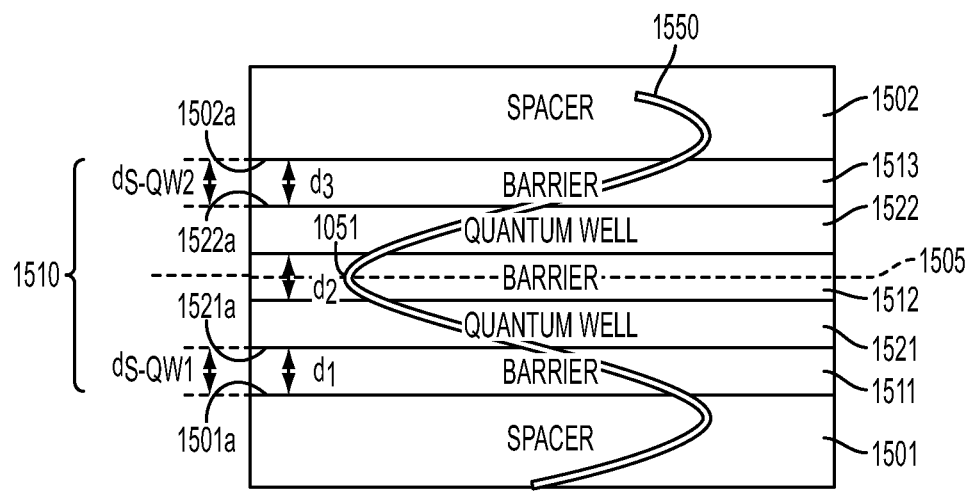
FIG. 15 shows a symmetrical quantum well structure disposed between two spacer layers.

FIG. 15 shows portion of a symmetrical quantum well structure 1010 disposed between two spacer layers 1501, 1502. The quantum well structure 1510 includes two quantum wells 1521, 1522 with barriers 1511, 1512, 1513, wherein a barrier is arranged on either side of each quantum well 1521, 1522. The quantum well structure is referred to as "symmetrical" because the quantum wells 1521, 1522 are evenly spaced with respect to the center line 1005 of the quantum well structure 1510. The thickness of the barriers 1511, 1512, 1513 is substantially equal, $d_1 = d_2 = d_3$. Furthermore, the distance, $d_{S-QW1}$, between the edge 1501a of a first spacer layer 1001 disposed on one side of the quantum well structure 1010 and an edge 1521a of a quantum well 1521 nearest to the spacer edge 1501a is substantially equal to the distance, $d_{S-QW2}$, between the edge 1502a of a second spacer layer 1502 disposed on another side of the quantum well structure 1510 and an edge 1522a of a quantum well 1522 nearest to the spacer edge 1502a. As can be appreciated from FIG. 15, for a symmetrical quantum well structure, the resonant periodic gain condition occurs when the antinode 1551 of the electric field 1550 substantially aligns with the center line 1505.

Figure 16:
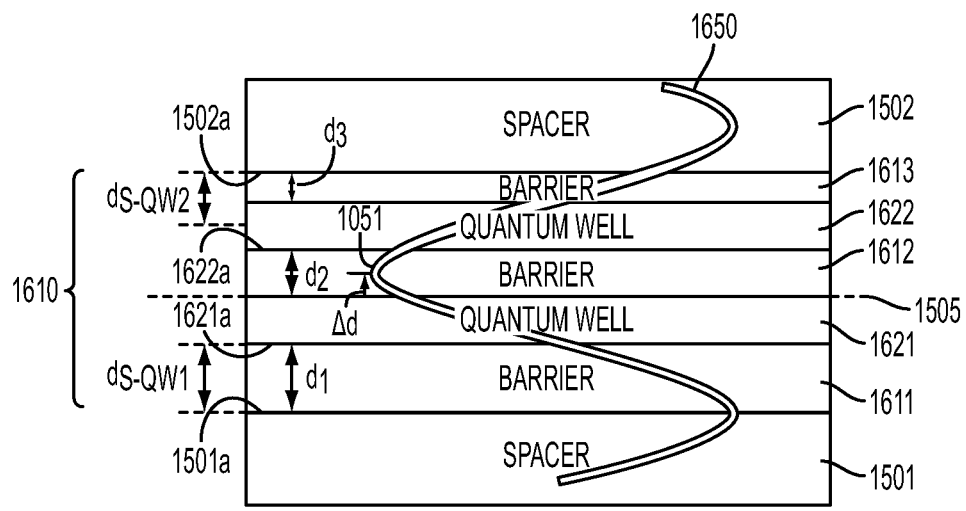
FIG. 16 shows an asymmetrical quantum well structure disposed between two spacer layers.

FIG. 16 shows an asymmetrical quantum well structure 1610 disposed between two spacer layers 1501, 1502. The quantum well structure 1610 includes two quantum wells 1621, 1622 with barriers 1611, 1612, 1613 wherein a barrier is arranged on either side of each quantum well 1621, 1622. In some configurations of the asymmetrical quantum well structure, quantum wells near the interface between the quantum well structure and the spacer layer may have no barrier or a thin barrier, e.g., a barrier having a thickness less than the thickness of the other barriers in the quantum well structure. The quantum well structure is referred to as "asymmetrical" because the quantum wells 1621, 1622 are not evenly spaced with respect to the center line 1505 of the quantum well structure 1610. The thickness of at last two of the barriers 1611, 1612, 1613 is unequal. In general, for asymmetrical quantum well structures the thickness of at least one of the barriers is different from the thicknesses of the other barriers in the quantum well structure. Furthermore, the distance, $d_{S-QW1}$, between the edge 1501a of a first spacer layer 1501 disposed on one side of the quantum well structure 1610 and an edge 1621a of a quantum well 1621 nearest to the spacer edge 1501a is not equal to the distance, $d_{S-QW2}$, between the edge 1502a of a second spacer layer 1502 disposed on another side of the quantum well structure 1610 and an edge 1622a of a quantum well 1622 nearest to the spacer edge 1502a. As can be appreciated from FIG. 16, for an asymmetrical quantum well structure, the resonant periodic gain condition occurs when the antinode 1651 of the electric field 1650 is shifted by an amount, $\Delta d$, from the center line 1505.

In the asymmetrical cases, each layer of the quantum well structure/spacer optical pairs may have a geometrical thickness of $\lambda_{lase}/4n$, where $\lambda_{lase}$ is the wavelength of the laser light and n is the refractive index of the layer. In some embodiments, the geometrical thickness of the spacer layers is $\lambda_{lase}/4n_S$, where $n_S$ is the refractive index of the spacer material. In these embodiments, the geometrical thickness of the quantum well structures is $\lambda_{lase}/4n_{eff}$, where $n_{eff}$ can be calculated for an asymmetrical quantum well structure as:

$$n_{eff} = ((\Sigma_{k=1}^{K} d_{QW_k} \cdot n_{QW}) + (\Sigma_{j=1}^{J} d_{BAR_j} \cdot n_{BAR})) / (\Sigma_{k=1}^{K} d_{QW_k} + \Sigma_{j=1}^{J} d_{BAR_j}),$$

where K is the total number of quantum wells in the quantum well structure, $d_{QW_k}$ is the thickness of the $k^{th}$ quantum well, $n_{QW}$ is the refractive index of the quantum wells, J is the total number of barriers in the quantum well structure, $d_{BAR_j}$ is the thickness of the jth barrier, and $n_{BAR}$ is the refractive index of the barriers.

In some configurations, the geometry of the laser cavity may satisfy boundary conditions so that two optical modes are resonant in the laser cavity. These optical modes have nearly the same wavelength. In these configurations, it can be helpful to include phase shift layers in the laser structure to reduce the possibility of these competitive optical modes. These phase shift layers operate to provide single mode operation in many cases.

Two example SEL structures (examples 4 and 5) are discussed below and are illustrated in FIGS. 17-24. These examples illustrate asymmetrical quantum well structures as well as phase shift layers. In examples 4 and 5, a number of quantum well structures are disposed on a substrate and the lasing wavelength is $\lambda = 266$ nm. In each example, the quantum well thicknesses are selected to be about 5 nm with 50% Al composition in the quantum wells and with 60% Al composition in the barriers. Spacer layers may be disposed between quantum well structures. The spacer layers have 100% Al composition.

Example 4

Figure 18:
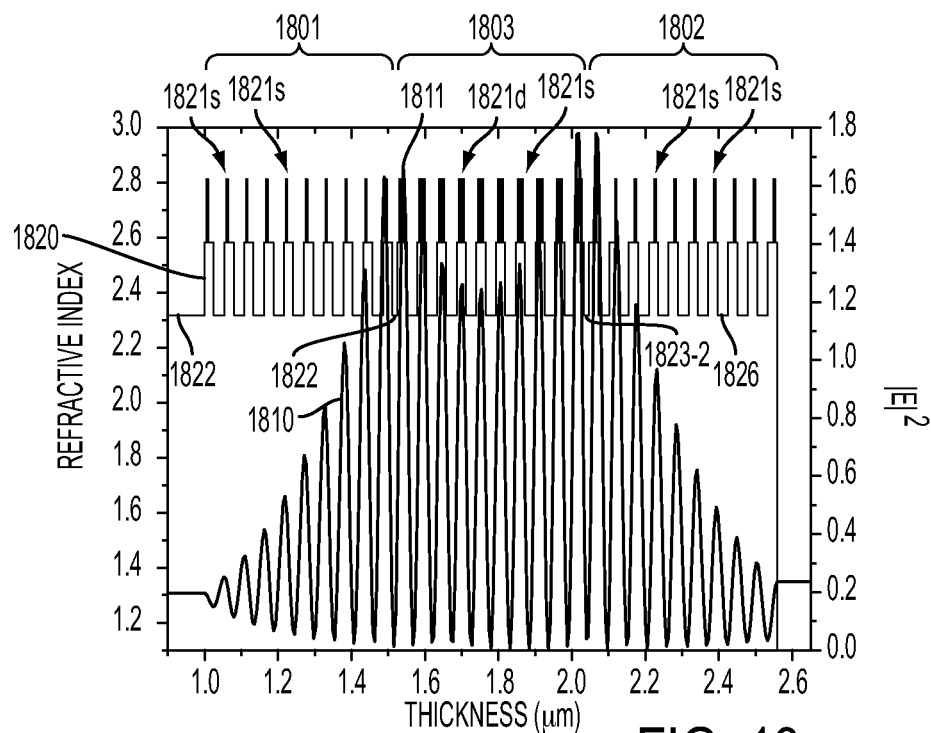
FIGS. 18 and 19 illustrate plots of the $|E|^2$ electrical field and refractive index in the DFB active zone of the SEL structure of FIGS. 17A-17B.

FIGS. 17A-17B illustrate the structure of an exemplary DFB SEL design for a lasing wavelength $\lambda = 266$ nm that uses a series (1803, FIG. 18) of ten symmetrical double quantum well structures (1821d, FIG. 18) disposed between first 1801 and second 1802 series of ten asymmetrical single quantum well structures (1821s, FIG. 18). A first 0.125$\lambda$ phase shift element 1823-1 disposed between the first series 1801 of single quantum well structures and the series 1803 of double quantum well structures and a second 0.125$\lambda$ phase shift element 1823-2 disposed between the series 1803 of double quantum well structures and the second series 1802 of single quantum well structures. Nine quantum well structures with spacer layers of the first and second series 1801, 1802 of signal quantum well structures 1825s have optical thickness of 0.5$\lambda$. The tenth single quantum well structure of the first series 1801 and the first single quantum well structure of the second series 1802 include phase shift layers 1823-1, 1823-2, respectively, and have optical thickness of 0.475$\lambda$. Each double quantum well structure with spacer layer 1825d has optical thickness 0.5$\lambda$.

Figure 19:
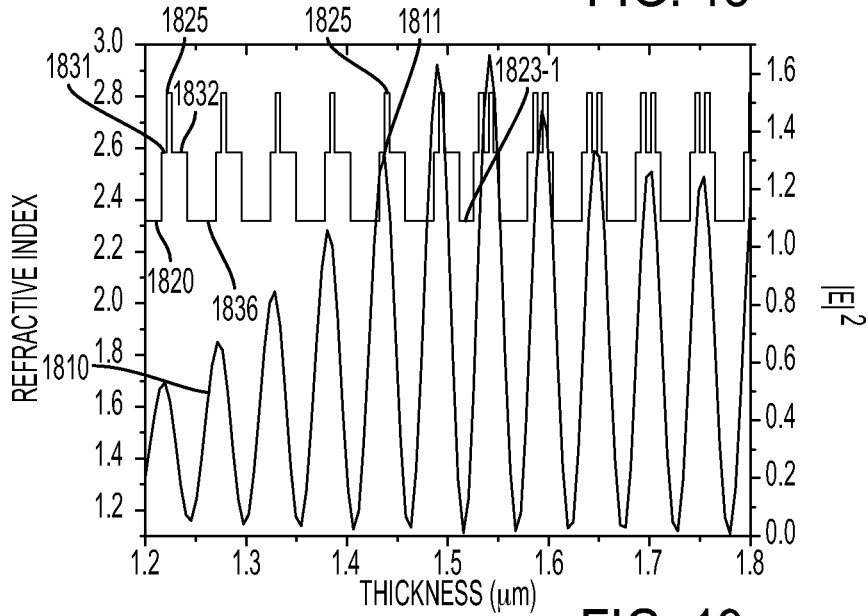
Figure 20:
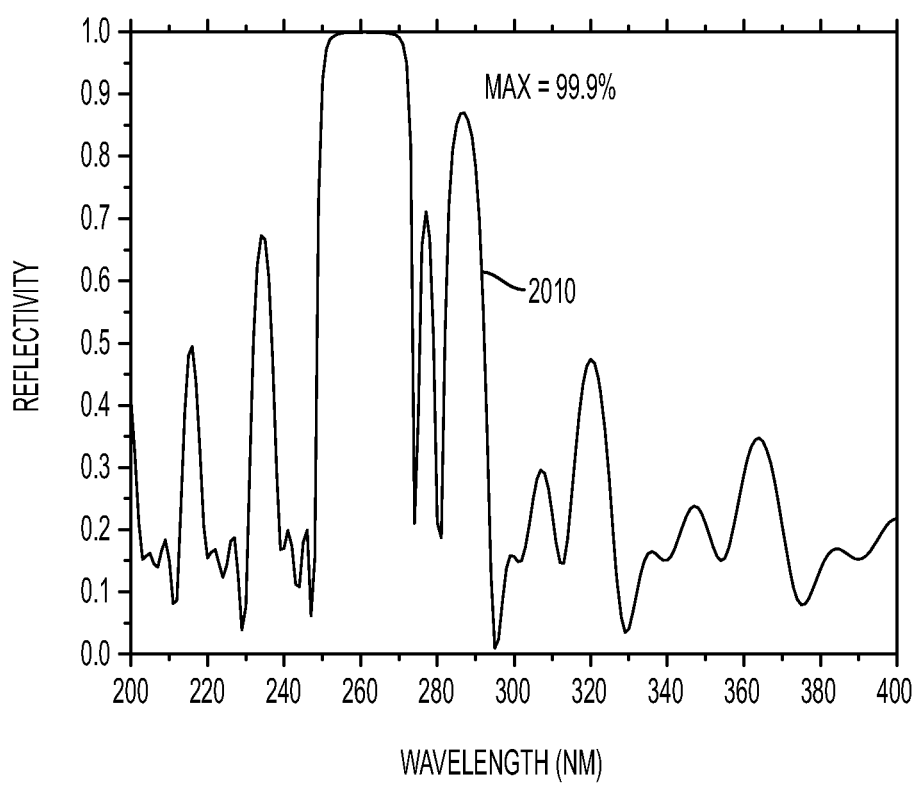
FIG. 20 shows the reflectivity spectra for the DFB SEL of FIGS. 17A-17B.

FIGS. 18 and 19 show plots of the $|E|^2$ electrical field 1810 and refractive index 1820 within the SEL from 0 to 2.6 μm (after the last quantum well structure). The refractive index plot 1820 indicates various structures within the SEL. It can be observed, particularly in FIG. 19, that the asymetry of the single quantum well structures 1821s in this example serves to align the quantum wells 1825 with the antinodes 1811 of the $|E|^2$ electrical field 1810. FIG. 20 provides a graph 2010 of the reflectivity of the structure of FIGS. 17A-17B indicating a reflectivity of greater than 99% at the lasing wavelength $\lambda = 266$ nm.

In the illustrated example, the SEL includes a substrate or template 1822 comprising AlN and having a refractive index of 2.319 at 266 nm, a physical thickness of 10000 Å, and an optical thickness of 8.718λ. The SEL includes:

1. $Al_{0.6}Ga_{0.4}N$ thin barrier (1831, FIG. 18) having a refractive index of 2.583 at 266 nm, a physical thickness of 51.49 Å, and an optical thickness of 0.05λ;

2. $Al_{0.5}Ga_{0.5}N$ quantum well (1825, FIG. 13) having a refractive index of 2.813 at 266 nm, a physical thickness of 47.28 Å, and an optical thickness of 0.05λ;

3. $Al_{0.6}Ga_{0.4}N$ thick barrier (1832, FIG. 18) having a refractive index of 2.583 at 266 nm, a physical thickness 154.47 Å (3×51.49 Å), and an optical thickness of 0.15λ (3×0.05λ);

4. AlN spacer layer (1826, FIG. 18) having a refractive index of 2.319 at 266 nm, a physical thickness of 286.8 Å, and an optical thickness of 0.25λ.

Layers 1-4 are repeated 9 times followed by:

5. $Al_{0.6}Ga_{0.4}N$ thin barrier (1831, FIG. 18) having a refractive index of 2.583 at 266 nm, a physical thickness of 51.49 Å, and an optical thickness of 0.05λ;

6. $Al_{0.5}Ga_{0.5}N$ quantum well (1825, FIG. 13) having a refractive index of 2.813 at 266 nm, a physical thickness of 47.28 Å, and an optical thickness of 0.05λ;

7. $Al_{0.6}Ga_{0.4}N$ thick barrier (1832, FIG. 18) having a refractive index of 2.583 at 266 nm, a physical thickness 154.47 Å (3×51.49 Å), and an optical thickness of 0.15λ (3×0.05λ).

The first series 1801 of single quantum well structures comprises layers 1-4 (9 times) and layers 5-7. The first series 1801 of single quantum well structures is followed by:

8. AlN phase shift element (1823-1, FIG. 18) having a refractive index of 2.319 at 266 nm, a physical thickness of 143.4 Å, and an optical thickness of 0.125λ;

9. $Al_{0.6}Ga_{0.4}N$ thin barrier (1831, FIG. 18) having a refractive index of 2.583 at 266 nm, a physical thickness of 51.49 Å, and an optical thickness of 0.05λ;

10. $Al_{0.5}Ga_{0.5}N$ quantum well (1825, FIG. 18) having a refractive index of 2.813 at 266 nm, a physical thickness of 47.28 Å, and an optical thickness of 0.05λ;

11. $Al_{0.6}Ga_{0.4}N$ thin barrier (1831, FIG. 18) having a refractive index of 2.583 at 266 nm, a physical thickness of 51.49 Å, and an optical thickness of 0.05λ;

12. $Al_{0.5}Ga_{0.5}N$ quantum well (1825, FIG. 18) having a refractive index of 2.813 at 266 nm, a physical thickness of 47.28 Å, and an optical thickness of 0.05λ;

13. $Al_{0.6}Ga_{0.4}N$ thin barrier (1831, FIG. 18) having a refractive index of 2.583 at 266 nm, a physical thickness of 51.49 Å, and an optical thickness of 0.05λ;

14. AlN spacer layer (1826, FIG. 18) having a refractive index of 2.319 at 266 nm, a physical thickness of 286.8 Å, and an optical thickness of 0.25λ.

Layers 9-14 are repeated nine times, followed by:

$Al_{0.6}Ga_{0.4}N$ thin barrier (1831, FIG. 18) having a refractive index of 2.583 at 266 nm, a physical thickness of 51.49 Å, and an optical thickness of 0.05λ;

15. $Al_{0.5}Ga_{0.5}N$ quantum well (1825, FIG. 18) having a refractive index of 2.813 at 266 nm, a physical thickness of 47.28 Å, and an optical thickness of 0.05λ;

16. $Al_{0.6}Ga_{0.4}N$ thin barrier (1831, FIG. 18) having a refractive index of 2.583 at 266 nm, a physical thickness of 51.49 Å, and an optical thickness of 0.05λ;

17. $Al_{0.5}Ga_{0.5}N$ quantum well (1825, FIG. 18) having a refractive index of 2.813 at 266 nm, a physical thickness of 47.28 Å, and an optical thickness of 0.05λ;

18. $Al_{0.6}Ga_{0.4}N$ thin barrier (1831, FIG. 18) having a refractive index of 2.583 at 266 nm, a physical thickness of 51.49 Å, and an optical thickness of 0.05λ.

The series 1803 of double quantum well structures includes layer 9-14 (repeated 9 times and layers 15-19. The series of double quantum well structures is followed by:

19. AlN phase shift element (1823-2, FIG. 18) having a refractive index of 2.319 at 266 nm, a physical thickness of 143.4 Å, and an optical thickness of 0.125λ;

20. $Al_{0.6}Ga_{0.4}N$ thick barrier (1832, FIG. 18) having a refractive index of 2.583 at 266 nm, a physical thickness 154.47 Å (3×51.49 Å), and an optical thickness of 0.15λ (3×0.05λ);

21. $Al_{0.5}Ga_{0.5}N$ quantum well (1825, FIG. 13) having a refractive index of 2.813 at 266 nm, a physical thickness of 47.28 Å, and an optical thickness of 0.05λ;

22. $Al_{0.6}Ga_{0.4}N$ thin barrier (1831, FIG. 18) having a refractive index of 2.583 at 266 nm, a physical thickness of 51.49 Å, and an optical thickness of 0.05λ;

23. AlN spacer layer (1826, FIG. 18) having a refractive index of 2.319 at 266 nm, a physical thickness of 286.8 Å, and an optical thickness of 0.25λ.

Layers 20-23 are repeated 9 times followed by:

24. $Al_{0.6}Ga_{0.4}N$ thick barrier (1832, FIG. 18) having a refractive index of 2.583 at 266 nm, a physical thickness 154.47 Å (3×51.49 Å), and an optical thickness of 0.15λ (3×0.05λ).

25. $Al_{0.5}Ga_{0.5}N$ quantum well (1825, FIG. 13) having a refractive index of 2.813 at 266 nm, a physical thickness of 47.28 Å, and an optical thickness of 0.05λ;

26. $Al_{0.6}Ga_{0.4}N$ thin barrier (1831, FIG. 18) having a refractive index of 2.583 at 266 nm, a physical thickness of 51.49 Å, and an optical thickness of 0.05λ.

The second series 1802 of single quantum well structures comprises layers 20-23 (repeated 9 times) plus layers 24-25.

Example 5

Figure 22:
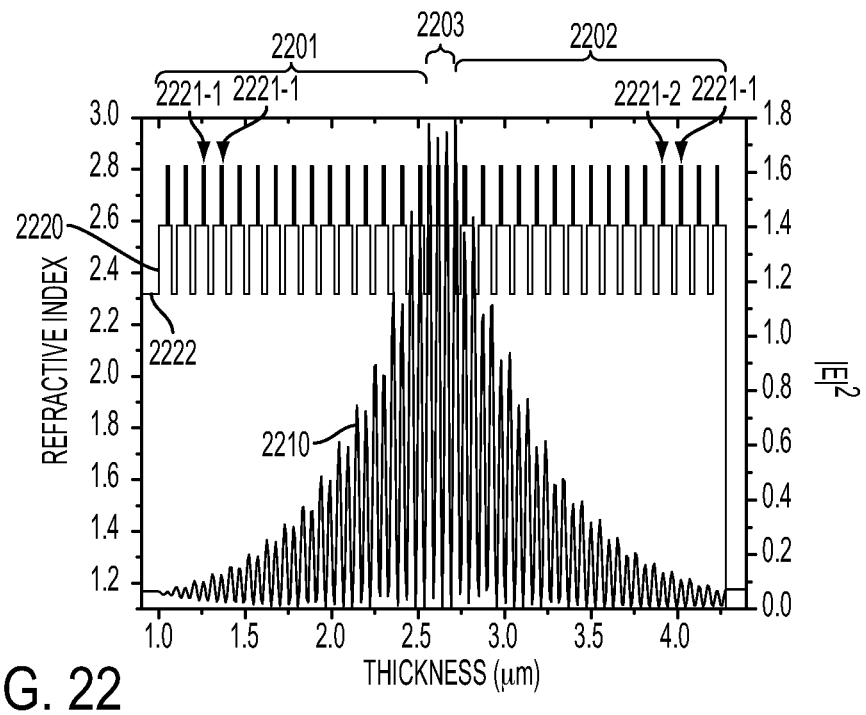
FIGS. 22 and 23 illustrate plots of the $|E|^2$ electrical field and refractive index in the DFB active zone of the SEL structure of FIG. 21.

FIG. 21 illustrates the structure of an exemplary DFB SEL design for a lasing wavelength λ=266 nm that uses a first series (2201, FIG. 22) of fifteen 1.0λ DBR pairs with asymmetrical double quantum well structures (2221-1, FIG. 22) and a second series (2202, FIG. 22) of fifteen 1.0λ DBR pairs with asymmetrical double quantum well structures (2221-2, FIG. 22). A phase shift element 2203 comprising a quadruple quantum well structure is disposed between the first 2201 and second 2202 series of fifteen 1.0λ DBR pairs with asymmetrical double quantum well structures (2221-1, 2221-2, FIG. 22).

Figure 23:
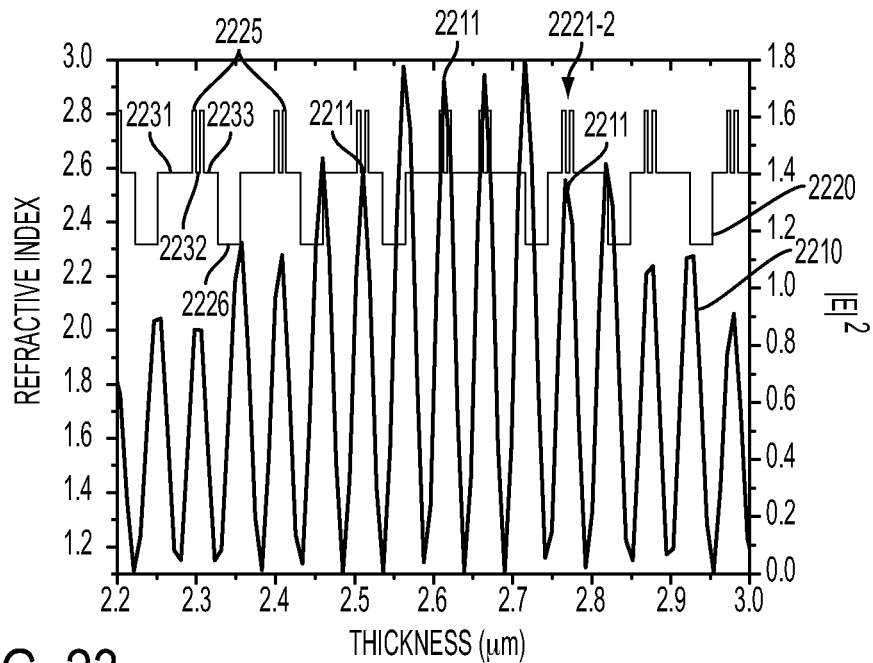

FIGS. 22 and 23 show plots of the $|E|^2$ electrical field 2210 and refractive index 2220 within the SEL from 0 to 2.6 μm (after the last quantum well structure). The refractive index plot 2220 indicates various structures within the SEL. It can be observed, particularly in FIG. 23, that the asymmetry of the double quantum well structures 2221-1, 2221-2 in this example serves to align the quantum wells 2225 with the antinodes 2211 of the $|E|^2$ electrical field 2210.

In the illustrated example, the SEL includes a substrate or template 2222 comprising AlN and having a refractive index of 2.319 at 266 nm, a physical thickness of 10000 Å, and an optical thickness of 8.718λ. The SEL includes:

1. $Al_{0.6}Ga_{0.4}N$ thick barrier (2231, FIG. 22) having a refractive index of 2.583 at 266 nm, a physical thickness of 434.3 Å, and an optical thickness of 0.425λ;

2. $Al_{0.5}Ga_{0.5}N$ quantum well (2225, FIG. 22) having a refractive index of 2.813 at 266 nm, a physical thickness of 46.92 Å, and an optical thickness of 0.05λ;

3. $Al_{0.6}Ga_{0.4}N$ thin barrier (1232, FIG. 22) having a refractive index of 2.583 at 266 nm, a physical thickness 51.1 Å and an optical thickness of $0.05\lambda$;

4. $Al_{0.5}Ga_{0.5}N$ quantum well (2225, FIG. 22) having a refractive index of 2.813 at 266 nm, a physical thickness of 46.92 Å, and an optical thickness of $0.05\lambda$;

5. $Al_{0.6}Ga_{0.4}N$ medium barrier (2233, FIG. 22) having a refractive index of 2.583 at 266 nm, a physical thickness of 178.9 Å, and an optical thickness of $0.175\lambda$;

6. AlN spacer layer (2226, FIG. 22) having a refractive index of 2.319 at 266 nm, a physical thickness of 284.6 Å, and an optical thickness of $0.25\lambda$.

The first series of double quantum well structures comprises layers 1-6 repeated 15 times. Layers 1-6 repeated 15 times are followed by:

7. $Al_{0.6}Ga_{0.4}N$ thick barrier (2231, FIG. 22) having a refractive index of 2.583 at 266 nm, a physical thickness of 434.3 Å, and an optical thickness of $0.425\lambda$;

8. $Al_{0.5}Ga_{0.5}N$ quantum well (2225, FIG. 22) having a refractive index of 2.813 at 266 nm, a physical thickness of 46.92 Å, and an optical thickness of $0.05\lambda$;

9. $Al_{0.6}Ga_{0.4}N$ thin barrier (1232, FIG. 22) having a refractive index of 2.583 at 266 nm, a physical thickness 51.1 Å and an optical thickness of $0.05\lambda$;

10. $Al_{0.5}Ga_{0.5}N$ quantum well (2225, FIG. 22) having a refractive index of 2.813 at 266 nm, a physical thickness of 46.92 Å, and an optical thickness of $0.05\lambda$;

11. $Al_{0.6}Ga_{0.4}N$ medium barrier (2233, FIG. 22) having a refractive index of 2.583 at 266 nm, a physical thickness of 178.9 Å, and an optical thickness of $0.175\lambda$;

12. $Al_{0.6}Ga_{0.4}N$ medium barrier (2233, FIG. 22) having a refractive index of 2.583 at 266 nm, a physical thickness of 178.9 Å, and an optical thickness of $0.175\lambda$;

13. $Al_{0.5}Ga_{0.5}N$ quantum well (2225, FIG. 22) having a refractive index of 2.813 at 266 nm, a physical thickness of 46.92 Å, and an optical thickness of $0.05\lambda$;

14. $Al_{0.6}Ga_{0.4}N$ thin barrier (1232, FIG. 22) having a refractive index of 2.583 at 266 nm, a physical thickness 51.1 Å and an optical thickness of $0.05\lambda$;

15. $Al_{0.5}Ga_{0.5}N$ quantum well (2225, FIG. 22) having a refractive index of 2.813 at 266 nm, a physical thickness of 46.92 Å, and an optical thickness of $0.05\lambda$;

16. $Al_{0.6}Ga_{0.4}N$ thick barrier (2231, FIG. 22) having a refractive index of 2.583 at 266 nm, a physical thickness of 434.3 Å, and an optical thickness of $0.425\lambda$;

17. AlN spacer layer (2226, FIG. 22) having a refractive index of 2.319 at 266 nm, a physical thickness of 284.6 Å, and an optical thickness of $0.25\lambda$.

Layers 12-17 are repeated 15 times followed by:

18. $Al_{0.6}Ga_{0.4}N$ medium barrier (2233, FIG. 22) having a refractive index of 2.583 at 266 nm, a physical thickness of 178.9 Å, and an optical thickness of $0.175\lambda$;

19. $Al_{0.5}Ga_{0.5}N$ quantum well (2225, FIG. 22) having a refractive index of 2.813 at 266 nm, a physical thickness of 46.92 Å, and an optical thickness of $0.05\lambda$;

20. $Al_{0.6}Ga_{0.4}N$ thin barrier (1232, FIG. 22) having a refractive index of 2.583 at 266 nm, a physical thickness 51.1 Å and an optical thickness of $0.05\lambda$;

21. $Al_{0.5}Ga_{0.5}N$ quantum well (2225, FIG. 22) having a refractive index of 2.813 at 266 nm, a physical thickness of 46.92 Å, and an optical thickness of $0.05\lambda$;

22. $Al_{0.6}Ga_{0.4}N$ thick barrier (2231, FIG. 22) having a refractive index of 2.583 at 266 nm, a physical thickness of 434.3 Å, and an optical thickness of $0.425\lambda$.

Figure 24:
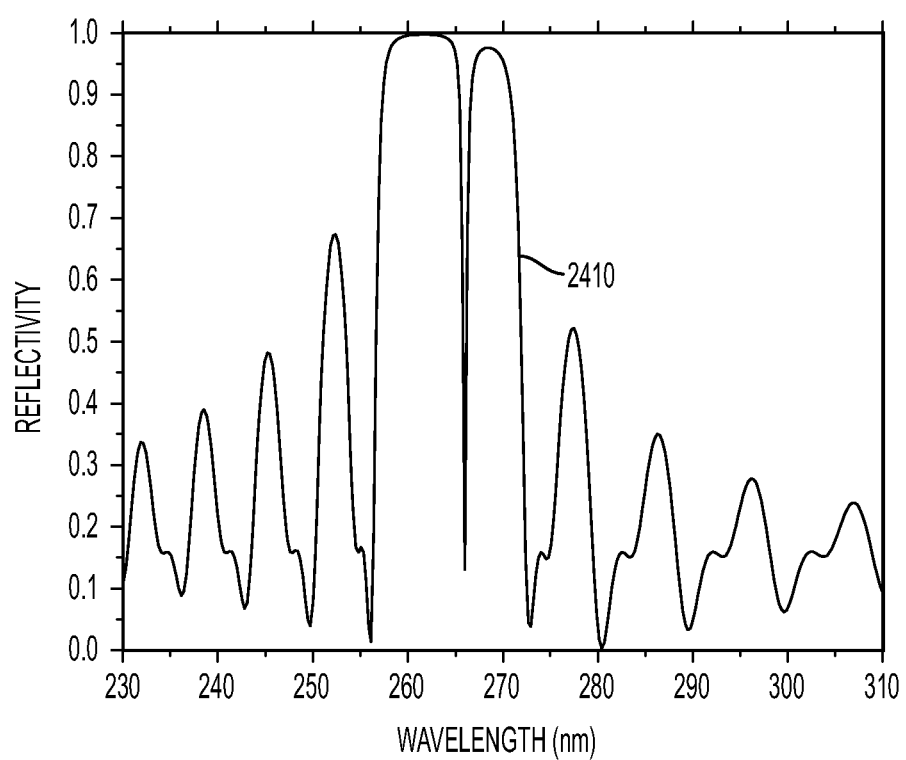
FIG. 24 shows the reflectivity spectra for the DFB SEL of FIG. 21.

The second series of double quantum well structures comprises the last 14 repetitions of layers 12-17 plus layers 18-22. The phase shift layer comprises layers 7-11 plus the first repetition of layers 12-17. FIG. 24 is a graph of the reflectivity of the structure of FIG. 21 showing greater than $99\lambda$ reflectivity at 266 nm.

In some embodiments, the DFB active zone as described herein can be used alone, without additional reflectors or gain elements. With a sufficient number of optical pairs, sufficient refractive index contrast between optical pairs, and sufficient number of gain structures, the DFB active zone can provide both acceptable optical feedback and optical gain for the DFB SEL, even when no additional reflectors and/or gain structures are employed.

Figure 25:
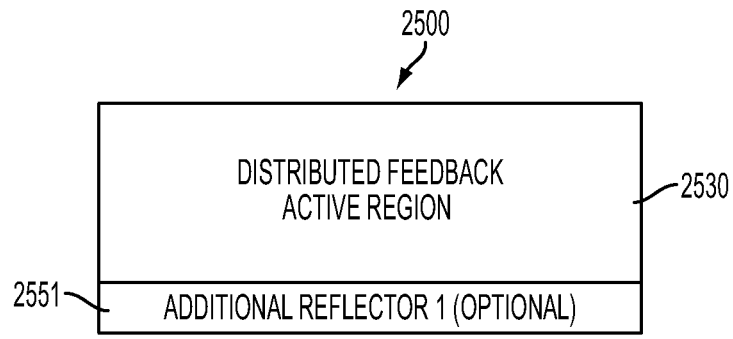
FIG. 25 depicts a DFB SEL that includes an additional reflector disposed at one surface of the DFB active zone.
Figure 26:
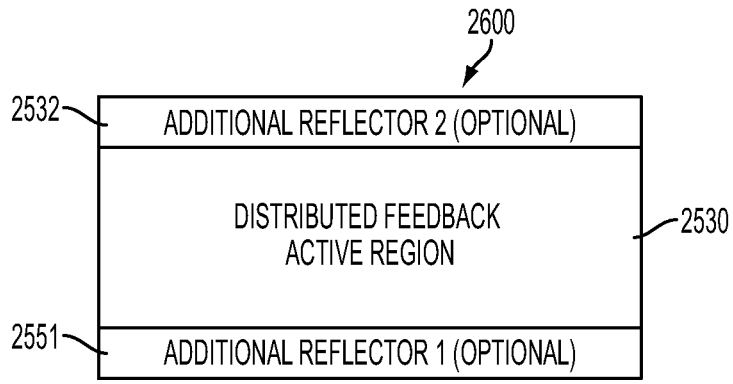
FIG. 26 illustrates a configuration wherein the DFB active zone is disposed between two additional reflectors.
Figure 27:
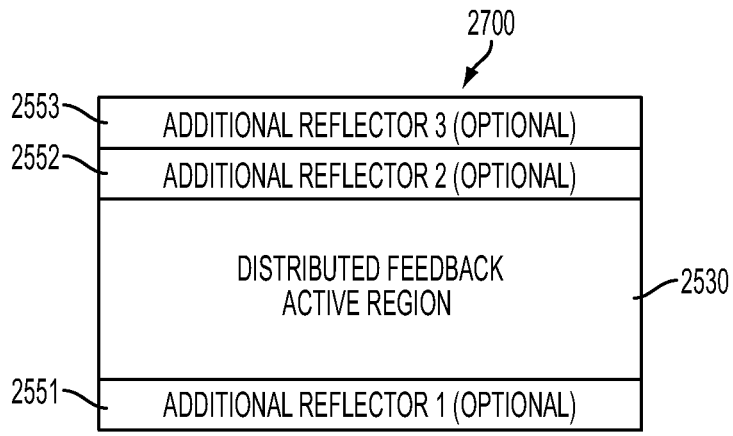
FIG. 27 depicts the use of two types of reflectors disposed at one or both sides of the DFB active zone.

In other embodiments, the DFB active zone may be used in conjunction with one or more additional reflectors, as illustrated by the schematic diagrams of FIGS. 25-27. FIG. 25 depicts an additional reflector 2551 disposed at one surface of the DFB active zone. This optional additional reflector 2551 may comprise a DBR having a number of optical pairs that provide additional reflectivity for the laser structure 2500. For example, the optical pairs may comprise alternating lower refractive index/higher refractive index layers of an epitaxially grown semiconductor material, such as AlN/AlGaN and/or GaN/AlInN. Each layer of the optical pairs may have a geometrical thickness of $\lambda_{lase}/4n$, where n is the refractive index of the layer, and is non-absorptive for the lasing emission wavelength $\lambda_{lase}$. These optical pairs do not include quantum wells or other gain media, and thus provide only optical feedback and no optical gain.

FIG. 26 illustrates another configuration 2600 that employs additional reflectors 2551, 2552 that may be implemented along with a DFB active zone 2530. In this embodiment the DFB active zone is disposed between two additional reflectors 2551, 2552. For example, in some embodiments, both of the additional reflectors 2551, 2552 may comprise epitaxially grown DBRs as described in connection with FIG. 25. In some embodiments, at least one of the reflectors 2551, 2552, e.g., reflector 2551, may comprise an epitaxially grown semiconductor DBR, and another of the reflectors, e.g., reflector 2552, may comprise a DBR formed from optical layer pairs comprising lower refractive index/higher refractive index layers of dielectric materials deposited on a surface of the DFB active zone, e.g., alternating TiO2/SiO2 layers.

In yet another exemplary configuration 900, shown in FIG. 27, two types of DBRs may be disposed at one or both sides of the DFB active zone, as shown in FIG. 927. FIG. 27 includes a first optional reflector 2751 disposed at one side, e.g., the bottom side of the DFB active zone 2730 and second and third optional reflectors 2752, 2753 disposed at an opposite side, e.g., the top side of the DFB active zone 2730. It will be understood that the double top reflectors 2752, 2753 may be used without the bottom reflector 2751, the bottom reflector 2751 may be used without the double top reflectors 2752, 2753 and/or one or more reflectors in addition to reflector 2751 may be disposed at the bottom of the DFB active zone. When double reflectors 2752, 2753 are used, the double reflectors may include at least one epitaxially grown semiconductor DBR, e.g., reflector 2752, and one deposited DBR comprising dielectric layers, e.g., reflector 2753.

Figure 28:
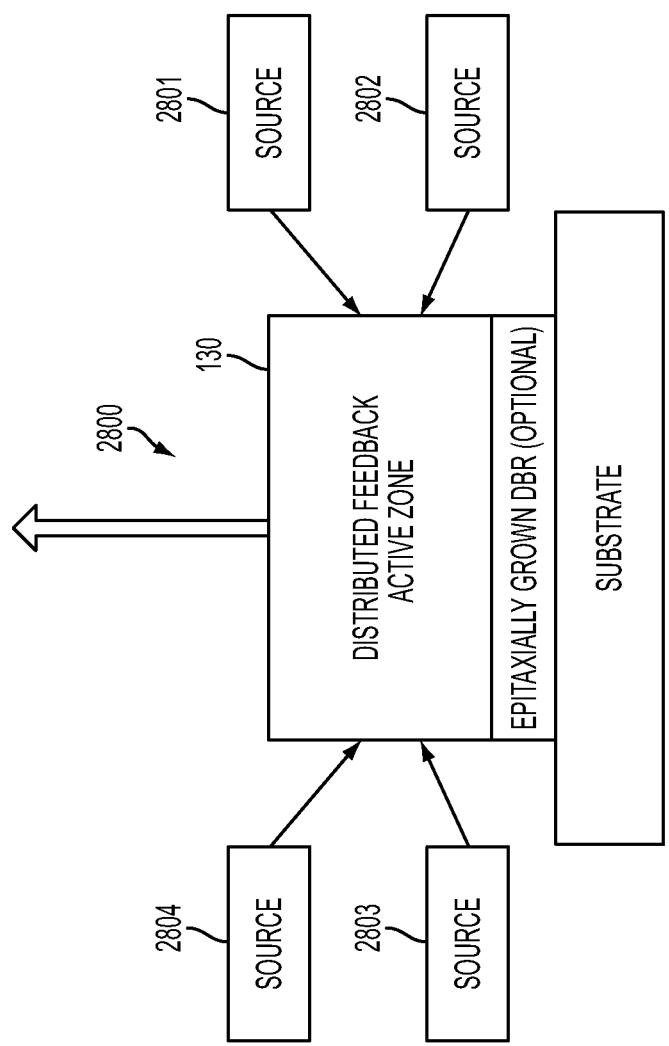
FIG. 28 illustrates a DFB SEL etched in a mesa structure and excited by multiple pump sources.

As previously discussed in connection with FIG. 1, an excitation source can be used to excite the DFB active zone. In some cases, multiple sources 2801-2804 can be used, as schematically illustrated in FIG. 28. In some embodiments, the excitation sources 2801-2804 can be light sources that provide light to optically pump the DFB active zone 130. The pump light may be incident on the top surface of the laser, as illustrated in FIG. 1, and/or the semiconductor heterostructure may be etched to form a mesa structure 2800 as shown in FIG. 28 with the light emitted from the pump sources 2801-

2804 incident on the sides of the mesa. The mesa structure may be formed using chemical assisted ion beam etching (or other appropriate process) to etch away portions of the heterostructure, yielding a mesa structure 2800 having, for instance, a diameter of about 100 μm with an exposed sidewall. The mesa structure allows for a large solid angle to be accessed for pumping with pump sources 2801-2804 (e.g., high-brightness diode lasers). The light output of the laser diodes is collimated and focused onto the pillar like semiconductor mesa 2800. In various embodiments, the cross-section of mesa (viewed axially) may be circular, or may have many other rectangular and non-rectangular cross sections.

Figure 29:
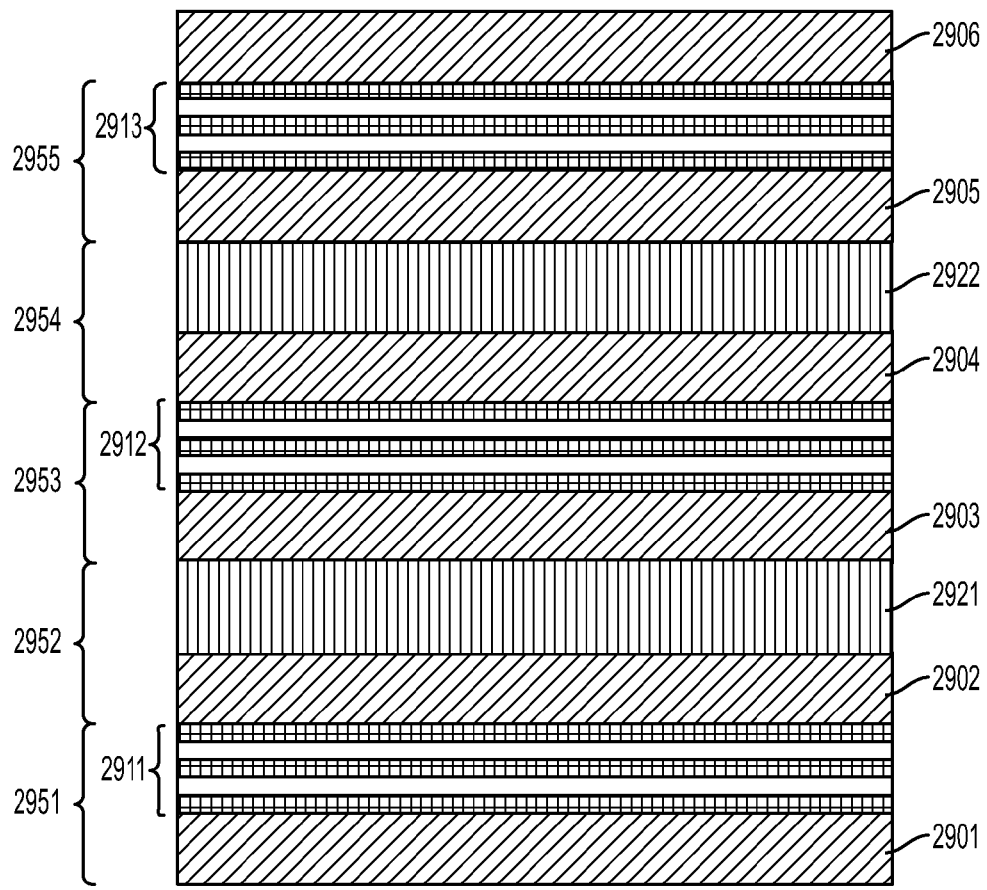
FIG. 29 shows a DFB active zone that includes quantum well structure/spacer layer optical pairs that alternate with no-gain, high refractive index layer/spacer layer optical pairs.

Referring back to FIGS. 4, 8, 12, 18, and 21, for example, it can be noted that in some cases the electric field within the DFB active zone fluctuates between periods of higher electric field magnitude and periods of lower electric field magnitude. The DFB active zone can be arranged to take advantage of these fluctuations by placing quantum well structures at the locations within the DFB active zone having a higher electric field magnitude and/or by placing DBR pairs at locations within the DFB active zone having lower electric field magnitude. FIG. 29 illustrates another possible embodiment for the DFB active zone wherein optical pairs that include quantum well structure and spacer layers are not uniformly used throughout the DFB active zone. In this scenario, the DFB active zone includes at least some optical pairs comprising a no-gain, high refractive index layer and a spacer layer. For example, the optical pairs comprising the quantum well structure and spacer layers may be disposed at locations within the DFB active zone having a higher electric field and the optical pairs comprising the no-gain, high refractive index layer and a spacer layer may be disposed at locations within the DFB active zone having a lower electric field.

FIG. 29 shows a DFB active zone that includes quantum well structure/spacer layer optical pairs that alternate with no-gain, high refractive index layer/spacer layer optical pairs. FIG. 29 illustrates five optical pairs 2951-2955 in the DFB active zone. The first optical pair 2951 illustrated in FIG. 29 comprises a spacer layer 2901 and a double quantum well structure 2911; the second optical pair 2952 comprises a spacer layer 2902 and a no-gain, high refractive index layer 2921; the third optical pair 2953 comprises a spacer layer 2903 and quantum well structure 2912; the fourth optical pair 2954 comprises a spacer layer 2904 and a no-gain, high refractive index layer 2922; the fifth optical pair 2955 comprises a spacer layer 1305 and quantum well structure 2913.

Systems, devices, or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the following detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims. The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A semiconductor surface emitting laser (SEL), comprising an active zone including quantum well structures separated by spacer layers, the quantum well structures configured to provide optical gain for the SEL at a lasing wavelength, $\lambda_{lase}$, each quantum well structure and an adjacent spacer layer configured to form an optical pair of a distributed Bragg reflector (DBR), the active zone including a plurality of the DBR optical pairs and configured to provide optical feedback for the SEL at $\lambda_{lase}$, wherein the optical feedback provided by the active zone is sufficient to cause the SEL to operate as a laser.

2. The SEL of claim 1, wherein $\lambda_{lase}$ is in a range between about 250 nm and about 550 nm.

3. The SEL of claim 1, further comprising one of:
  an optical pump source configured to emit pump light at pump wavelength, $\lambda_{pump}$, the pump source arranged to optically pump the SEL; and
  an electron beam source configured to emit an electron beam as excitation source for the active zone of the SEL.

4. The SEL of claim 1 further comprising a pump source configured to provide in-well pumping of the SEL.

5. The SEL of claim 1, further comprising a pump source configured to provide barrier pumping of the SEL.

6. The SEL of claim 1, wherein the active zone comprises one or more mesa structures and further comprising an optical pump source configured to optically pump the SEL side walls of the one or more mesas structures.

7. The SEL of claim 1, further comprising one or more additional DBRs that do not provide optical gain disposed adjacent to the active zone.

8. The SEL of claim 7, wherein the one or more additional DBRs comprise only one DBR.

9. The SEL of claim 1, wherein the active zone includes one or more first optical pairs that provide the optical gain and the optical feedback interspersed with one or more second optical pairs that provide the optical gain without providing the optical feedback.

10. The SEL of claim 1, wherein the active zone includes one or more first optical pairs that provide the optical gain and the optical feedback interspersed with one or more third optical pairs that provide the optical feedback without providing the optical gain.

11. The SEL of claim 1, wherein the active zone includes at least one phase shift element, the phase shift element configured to shift a phase of an optical mode present within the active zone during operation of the SEL.

12. The SEL of claim 11, wherein the phase shift element comprises an optical gain element.

13. A surface emitting laser (SEL), comprising an active zone including quantum well structures, each quantum well structure including one or more quantum wells comprising $Al_xGa_{1-x}N$, the quantum well structures separated by spacer layers comprising $Al_yGa_{1-y}N$, where y>x, the quantum well structures configured to provide optical gain for the SEL at a lasing wavelength, $\lambda_{lase}$, each quantum well structure and an adjacent spacer layer configured to form an optical pair of a distributed Bragg reflector (DBR), the quantum well structure configured to provide a high refractive index portion of the optical pair and the spacer layer configured to provide a low refractive index portion of the optical pair, the DBR including a plurality of the optical pairs and configured to provide optical feedback for the SEL at $\lambda_{lase}$, wherein the optical feedback provided by the active zone is sufficient to cause the SEL to operate as a laser.

14. The SEL of claim 13, wherein a number of the optical pairs is sufficient to provide a reflectivity of greater than about 98% at $\lambda_{lase}$.

15. The SEL of claim 13, wherein the active zone is epitaxially grown on a bulk AlN substrate.

16. A semiconductor surface emitting laser (SEL), comprising an active zone including quantum well structures separated by spacer layers, the quantum well structures configured to provide optical gain for the SEL at a lasing wavelength, $\lambda_{lase}$, each quantum well structure and an adjacent spacer layer configured to form an optical pair of a distributed Bragg reflector (DBR), the active zone including a plurality of the DBR optical pairs and configured to provide optical feedback for the SEL at $\lambda_{lase}$, wherein at least some of the quantum well structures are asymmetrical, each asymmetrical quantum well structure having one or more quantum wells and one or more barriers and the one or more quantum wells are not centered between spacer layers adjacent to the quantum well structure, wherein the optical feedback provided by the active zone is sufficient to cause the SEL to operate as a laser.

17. The SEL of claim 16, wherein substantially all of the quantum well structures are asymmetrical.

18. The SEL of claim 16, further comprising one or more additional DBRs that do not provide optical gain disposed adjacent to the active zone.

19. The SEL of claim 18, wherein the one or more additional DBRs comprise only one DBR.

20. A semiconductor surface emitting laser (SEL), comprising an active zone including:
   means for providing optical gain for the SEL at a lasing wavelength, $\lambda_{lase}$; and
   means for providing optical feedback for the SEL at $\lambda_{lase}$, wherein the means for providing optical gain and the means for providing optical feedback are distributed throughout the active zone, wherein the optical feedback provided by the active zone is sufficient to cause the SEL to operate as a laser.

* * * * *